US012599039B2

(12) United States Patent
Liu et al.

(10) Patent No.: US 12,599,039 B2
(45) Date of Patent: Apr. 7, 2026

(54) LED CHIP MODULE AND METHOD FOR MANUFACTURING LED CHIP MODULE

(71) Applicant: Shenzhen Jufei Optoelectronics Co., Ltd., Shenzhen (CN)

(72) Inventors: Yong Liu, Shenzhen (CN); Yanming Chen, Shenzhen (CN); Pingru Sun, Shenzhen (CN); Meizheng Xing, Shenzhen (CN); Hongbo Su, Shenzhen (CN)

(73) Assignee: SHENZHEN JUFEI OPTOELECTRONICS CO., LTD, Shenzhen (CN)

( * ) Notice: Subject to any disclaimer, the term of this patent is extended or adjusted under 35 U.S.C. 154(b) by 764 days.

(21) Appl. No.: 17/830,747

(22) Filed: Jun. 2, 2022

(65) Prior Publication Data

US 2022/0293574 A1     Sep. 15, 2022

Related U.S. Application Data

(63) Continuation-in-part of application No. PCT/CN2021/077672, filed on Feb. 24, 2021, and a
(Continued)

(30) Foreign Application Priority Data

Dec. 3, 2019    (CN) .......................... 201911222587.X
Dec. 11, 2019   (CN) .......................... 201911269921.7
(Continued)

(51) Int. Cl.
*H01L 25/075*     (2006.01)
*H10H 20/831*     (2025.01)
*H10H 20/857*     (2025.01)

(52) U.S. Cl.
CPC ..... *H01L 25/0753* (2013.01); *H10H 20/8312* (2025.01); *H10H 20/857* (2025.01)

(58) Field of Classification Search
None
See application file for complete search history.

(56) References Cited

U.S. PATENT DOCUMENTS

2002/0167085 A1   11/2002  Ohuchi et al.
2003/0222353 A1   12/2003  Yamada
(Continued)

FOREIGN PATENT DOCUMENTS

CN       102248756 A    11/2011
CN       103456875 A    12/2013
(Continued)

OTHER PUBLICATIONS

Machine Translation of KR20110093409A (Year: 2011).*
(Continued)

*Primary Examiner* — Yara B Green
*Assistant Examiner* — Fakeha Sehar
(74) *Attorney, Agent, or Firm* — Birch, Stewart, Kolasch & Birch, LLP

(57)     ABSTRACT

A flip LED chip module and a method for manufacturing LED chip module are provided. In the manufactured flip LED chip module, the second glue layer for reducing light energy is formed on the front surface of each of the flip LED chips. Therefore, the difference between the light intensity of the light along the normal direction of the flip LED chip and the light intensity of the light at the four sides of the flip LED chip can be reduced, thus improving the uniformity of the color of the light. Hence, the color of the light of the LED device manufactured by the LED chip module can be more uniform, thus improving the quality of the LED device and the user satisfaction.

10 Claims, 15 Drawing Sheets

Related U.S. Application Data continuation-in-part of application No. PCT/CN2020/135804, filed on Dec. 11, 2020, and a continuation-in-part of application No. PCT/CN2020/133441, filed on Dec. 2, 2020.

(30) Foreign Application Priority Data

| | | |
|---|---|---|
| Feb. 28, 2020 | (CN) ........................ | 202010128155.9 |
| Feb. 28, 2020 | (CN) ........................ | 202010128156.3 |

(56) References Cited

U.S. PATENT DOCUMENTS

| | | | | |
|---|---|---|---|---|
| 2012/0305969 A1* | 12/2012 | Sato | ........................ | H01L 24/97 |
| | | | | 252/582 |
| 2014/0034981 A1* | 2/2014 | Hung | ................... | H10H 20/831 |
| | | | | 257/98 |
| 2015/0056755 A1 | 2/2015 | Kim et al. | | |
| 2018/0090639 A1* | 3/2018 | Ting | ................... | H10H 20/8314 |
| 2019/0006559 A1 | 1/2019 | Lai et al. | | |
| 2019/0115274 A1* | 4/2019 | Hu | ...................... | H01L 23/3192 |
| 2022/0123191 A1* | 4/2022 | Yamada | ............... | H10H 20/857 |

FOREIGN PATENT DOCUMENTS

| | | | | | |
|---|---|---|---|---|---|
| CN | 103972360 A | | 8/2014 | | |
| CN | 104309282 A | | 1/2015 | | |
| CN | 105047786 A | | 11/2015 | | |
| CN | 207697248 U | | 8/2018 | | |
| CN | 108682729 A | * | 10/2018 | .......... | H10H 20/851 |
| CN | 108767100 A | | 11/2018 | | |
| CN | 208315595 U | | 1/2019 | | |
| CN | 109768146 A | | 5/2019 | | |
| CN | 212400588 U | | 1/2021 | | |
| KR | 20110093409 A | * | 8/2011 | | |
| KR | 10-2013-0013458 A | | 2/2013 | | |

OTHER PUBLICATIONS

Machine Translation of CN108682729A (Year: 2018).*

International Search Report, issued in PCT/CN2020/133441, dated Mar. 3, 2021.

International Search Report, issued in PCT/CN2020/135804, dated Mar. 10, 2021.

International Search Report, issued in PCT/CN2021/077672, dated Apr. 25, 2021.

* cited by examiner

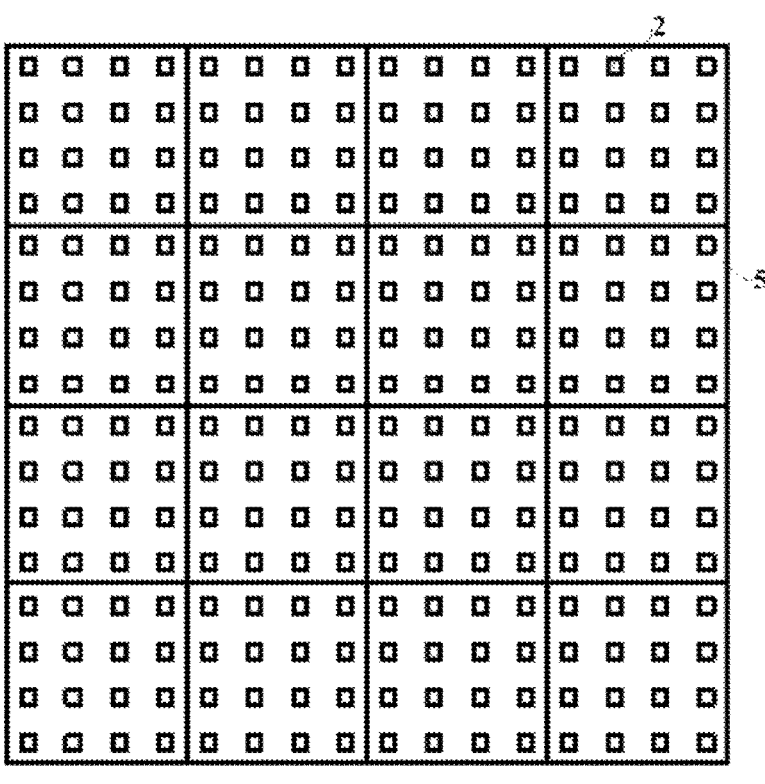
FIG. 7
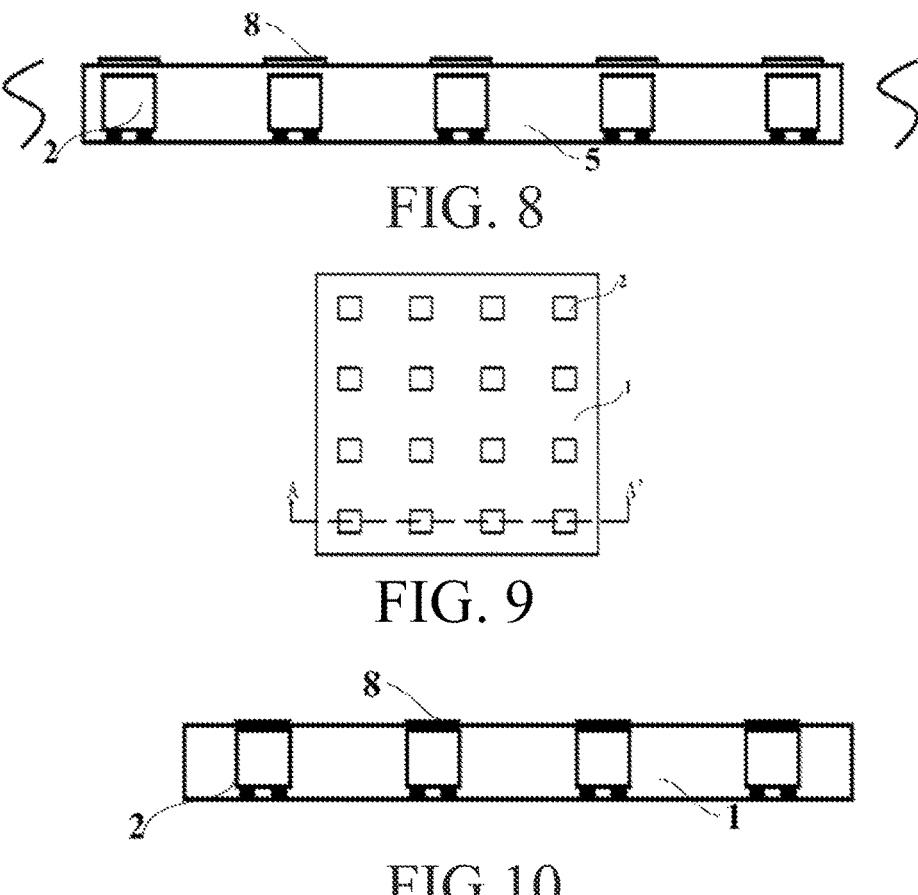
FIG. 8
FIG. 9
FIG.10

50

51

52

70

710                          72

282

281

282

281

281

282

283

282

LED CHIP MODULE AND METHOD FOR MANUFACTURING LED CHIP MODULE

CROSS-REFERENCE TO RELATED APPLICATIONS

This application is a continuation-in-part application claiming benefit of PCT Application No. PCT/CN2020/133441, filed on Dec. 2, 2020, which claims priority to Chinese Patent Application No. CN201911222587.X filed on Dec. 3, 2019.

This application is a continuation-in-part application claiming benefit of PCT Application No. PCT/CN2020/135804, filed on Dec. 11, 2020, which claims priority to Chinese Patent Application No. CN201911269921.7 filed on Dec. 11, 2019.

This application is a continuation-in-part application claiming benefit of PCT Application No. PCT/CN2021/077672, filed on Feb. 24, 2021, which claims priority to Chinese Patent Applications No. CN202010128155.9 filed on Feb. 28, 2020 and CN 202010128156.3 filed on Feb. 28, 2020.

TECHNICAL FIELD

The present disclosure relates to the light emitting diode (LED) field, and more particularly to an LED chip module and a method for manufacturing LED module.

RELATED ART

Upon watching videos, video quality directly affects emotions and life qualities of human beings. 8K Ultra high display (UHD) videos are trends for future developments. Mini LEDs and micro LEDs may be provided for backlight displays and direct displays and thus meet the development criteria of UHD videos. It is realized that, not only the backlight displays (blue light or white light) but also the direct displays (RGB) demand uniform illumination and consistent colors.

Along with the progress and development of society, the technology of display devices, from backlight displays of LCD modules to OLEDs, micro LEDs, mini LEDs of end devices, and the like, also continuously advance. It is a vision to miniaturize the LED module for relevant technicians. It is also understood that, the smaller the light emitting unit provided on the LED module is, the more precise and exquisite the display effect performed by the LED module is. Moreover, because the size of the light emitting unit is small, pouring glues or applying solder paste on the light emitting unit is difficult. Upon applying glues or solder paste on the light emitting unit by using screen printing, because the hole size of the printing screen is small, some glues or solder pastes may fail to demold from the printing screen. As a result, the LED cannot be adhered or soldered properly, thus directly affecting the product yield of the LED module.

Regarding the application of mini LEDs, flip-chip printing is applied in the die-bonding procedure. In general, each of the wiring boards has thousands of or even millions of soldering spots for being connected to LED chips. Such huge number of soldering spots makes the packaging of the mini LEDs difficult. Owing to the requirements of densely arrangements of the LED chips, the chip size of the mini LEDs is of a micrometer scale. However, in the case that the pad size of the chip is less than 2000 $\mu m^2$, because the pad size of the chip is small, the contact area between the chip and the solder paste is also small. As a result, the bonding force between the chip pad and the solder paste is relatively small. Consequently, issues such as open circuit of the products, insufficient illumination of the products, blinking of the products, or the like thus occur, thus greatly affecting the product reliability.

As known to the inventor, using mini LEDs in backlight displays may have following two ways.

The first way: Flip blue-light chips with certain spacing are disposed and fixed on a substrate, and a transparent glue layer is molded on the chips. Currents are applied to drive the blue-light chips to emit blue light. The blue light excites the QD film (quantum dot film) to convert the blue light into white light, and the white light thus can be provided as the backlight source of an LCD TV. Because the light intensity of the light along the normal direction of the chip is much stronger than the light intensity of the light at the peripheral portions of the chip, the uniformity of the colors of the light is unsatisfactory.

The second way: Flip blue-light chips with certain spacing are disposed and fixed on a substrate, and a fluorescent glue layer (comprising RG powders or YG powders) is molded on the chips. Currents are applied to drive the blue-light chips to emit blue light. The blue light excites the fluorescent glue layer to achieve light mixing to emit white light, and the white light thus can be provided as the backlight source of an LCD TV. Because number of the fluorescent powders distributed on the portions between the chips and the number of the fluorescent powders distributed on the peripheral portions of the chips are substantially the same, when the chips emit light, the color of the light above the chip and the color of the light around the chip are different (for example, the color of the light above the chips is white, and the color of the light between the chips is pale yellow).

As a result, no matter with the first way or the second way, uniformity and consistency of the color of the light of the backlight source are insufficient. A main reason for the issue is that the light intensity of the light along the normal direction of the chip is much stronger than the light intensity of the light at the peripheral portions of the chip.

SUMMARY

According to one or some embodiments of the present disclosure, a flip LED chip module and a method for manufacturing flip LED chip module are provided. Therefore, the issue that the insufficient uniformity of the color of the light owing that the light intensity of the light along the normal direction of the chip is much stronger than the light intensity of the light at the peripheral portions of the chip can be solved. Moreover, the issue that the bonding force between the chip pad and the solder paste is relatively small owing that the pad size of the mini LED chip is small and thus greatly affecting the product reliability can be solved.

In order to address the aforementioned issue(s), according to one or some embodiments of the present disclosure, an LED chip module which is capable of performing uniform light emission can be further provided, and the LED chip module is manufactured by the aforementioned manufacturing method.

According to a flip LED chip module of an embodiment of the present disclosure, the flip LED chip module comprises a substrate; at least one flip LED chip, wherein a positive electrode and a negative electrode of the at least one flip LED chip are electrically connected to corresponding chip electrode pads on the substrate through a conductive connection material, respectively; a first glue layer formed on the substrate and covering and packaging the at least one flip LED chip; and a second glue layer, wherein the second glue layer covers at least parts of a front light-emitting surface of the at least one flip LED chip and does not cover a portion of the first glue layer adjacent to the at least one flip LED chip; an area of the second glue layer is equal to or less than an area of the front light-emitting surface of the at least one flip LED chip.

Optionally, according to one or some embodiments of the present disclosure, the second glue layer is a white glue layer or a semitransparent glue layer and comprises scattering particles, or the second glue layer is a light conversion glue layer.

Optionally, according to one or some embodiments of the present disclosure, a number of the at least one flip LED chip is two, and the at least two flip LED chips are arranged as an N×N array, where N is an integer equal to or greater than 2; or the at least two flip LED chips are arranged as an M×N array, where N is an integer equal to or greater than 2, M is an integer equal to or greater than 1, and M and N have different values.

According to a flip LED chip of an embodiment of the present disclosure, the flip LED chip comprises a chip body and pads on a bottom portion of the chip body, wherein the pads comprise an N electrode pad and a P electrode pad; the bottom portion of the chip body is provided with two pad slots recessed upwardly, the N electrode pad is disposed on a bottom of one of the two pad slots, the P electrode pad is disposed on a bottom of the other of the two pad slots, and a gap is between a side surface of each of the pads and a side wall of a corresponding pad slot of the two pad slots.

Optionally, according to one or some embodiments of the present disclosure, an absolute value of a difference between a height of each of the pads and a depth of the corresponding pad slot is less than or equal to 20 μm.

Optionally, according to one or some embodiments of the present disclosure, a cross-sectional area of each of the pads gradually decreases from the bottom of the corresponding pad slot to an opening of the corresponding pad slot distant from the bottom of the corresponding pad slot.

Optionally, according to one or some embodiments of the present disclosure, for each of the pad slots, the side wall of the pad slot is perpendicular to the bottom surface of the chip body, or the cross-sectional area of the pad slot gradually increases from the bottom of the pad slot to the opening of the pad slot.

Optionally, according to one or some embodiments of the present disclosure, the gap between the side surface of each of the pads and the side wall of the corresponding pad slot gradually increases from the bottom of the corresponding pad slot to the opening of the corresponding pad slot distant from the bottom of the corresponding pad slot.

Optionally, according to one or some embodiments of the present disclosure, a friction coefficient of the bottom portion of each of the pads is greater than a friction coefficient of the bottom portion of the chip body.

Optionally, according to one or some embodiments of the present disclosure, the bottom surface and/or the side surface of each of the pads is zigzag-shaped or wavy-shaped.

According to an embodiment of the present disclosure, a wiring board is also provided and comprises a substrate and at least one flip LED chip mentioned in any one of the aforementioned embodiments; the pads of the at least one flip LED chip are soldered to a chip configuration region of the substrate and electrically connected to the circuitry inside the substrate.

According to a method for manufacturing LED device of an embodiment of the present disclosure, the method comprises: manufacturing an LED chip module which is capable of performing light emission uniformly by using the aforementioned manufacturing method; transferring the LED chip module to the substrate and electrically connecting the positive electrode and the negative electrode of each of the LED chips of the LED chip module to corresponding chip electrode pads on the substrate.

According to a flip LED chip module of an embodiment of the present disclosure, the flip LED chip module comprises a substrate and a flip LED chip, wherein a conductive connection material is provided on portions of an upper surface of the substrate corresponding to pads of the flip LED chip; wherein a positive electrode and a negative electrode of the flip LED chip are disposed on the portions of the substrate covered by the conductive connection material and are electrically connected to the pads of flip LED chip; a bottom portion of a chip body of the flip LED chip is provided with two pad slots recessed upwardly, the pad corresponding to the positive electrode is disposed on a bottom of one of the two pad slots, the pad corresponding to the negative electrode is disposed on a bottom of the other one of the two pad slots, and a gap is between a side surface of each of the pads and a side wall of a corresponding pad slot of the two pad slots.

According to a printing screen of an embodiment of the present disclosure, the printing screen is applicable in printing LED pads. The printing screen is a plate of a block shape. The plate has a plurality of through holes defined through an upper surface and a lower surface of the plate, and a hole diameter of each of the through holes gradually increases along a direction from the upper surface of the plate to the lower surface of the plate. A position of the through hole corresponds to a position of the LED pad.

Optionally, according to one or some embodiments of the present disclosure, in each of the through holes, an outline of the through hole is rectangular, circular, or elliptical, and the shapes of the through holes of a same printing screen are the same.

Optionally, according to one or some embodiments of the present disclosure, in each of the through holes, in the case that the outline of the through hole is rectangular, an edge portion or a corner portion of the through hole on a lower surface of the plate is provided with a chamfer structure or a notch.

Optionally, according to one or some embodiments of the present disclosure, in each of the through holes, a hole wall of the through hole is curved or inclined.

Optionally, according to one or some embodiments of the present disclosure, in each of the through holes, in the case that the outline of the through hole is circular or elliptical, the hole wall of the through hole is curved; in the case that the outline of the through hole is rectangular, the hole wall of the through hole is formed by four inclined surfaces or four curved surfaces.

Optionally, according to one or some embodiments of the present disclosure, in each of the through holes, in the case that the outline of the through hole is rectangular, an angle between a wall portion of a short side of the through hole and the lower surface of the plate is less than or equal to an angle between a wall portion of a long side of the through hole and the lower surface of the plate.

Optionally, according to one or some embodiments of the present disclosure, in each of the through holes, the angle between a wall portion of the through hole and the lower surface of the plate is in a range between 10 degrees and 85 degrees.

Optionally, according to one or some embodiments of the present disclosure, in each of the through holes, a smooth covering layer is provided on the hole wall.

Optionally, according to one or some embodiments of the present disclosure, in each of the through holes, the smooth covering layer is a nickel-coating layer.

Optionally, according to one or some embodiments of the present disclosure, the printing screen is made of steel or nickel.

Optionally, according to one or some embodiments of the present disclosure, in the case that the printing screen is made of nickel, the printing screen is manufactured by using evaporation to growth nickel.

Optionally, according to one or some embodiments of the present disclosure, the conductive connection material comprises one selected from the group consisting of solder paste and silver glue.

Optionally, according to one or some embodiments of the present disclosure, in the case that the conductive connection material comprises solder paste, a composition of the solder paste comprises germanium; in the case that the conductive connection material comprises silver glue, a composition of the sliver paste comprises a mixture of sliver powders and glue, and the sliver powders comprise silver particles and silver bulks.

Beneficial Effects

According to one or some embodiments of the present disclosure, an LED chip module and a method for manufacturing an LED chip module are provided. Flip LED chips are arranged on the front surface of the adhesive film, and the positive electrode and the negative electrode of each of the flip LED chips are adhered to the front surface of the adhesive film; a first glue layer is formed on the front surface of the adhesive film to cover and package the flip LED chips; a second glue layer for reducing the light energy of the light emitted from the front light-emitting surface of the flip LED chip (the light-emitting surface at the front surface of the flip LED chip) is formed on the first glue layer, and the second glue layer covers at least parts of the front light-emitting surface of the flip LED chip and does not cover a portion of the first glue layer adjacent to the flip LED chip; then, the first glue layer is cut to obtain a plurality of LED chip modules. The LED chip module manufactured by the aforementioned process at least has following advantages.

Because the second glue layer for reducing light energy is formed on the front surface of the flip LED chip, the difference between the light intensity of the light along the normal direction of the flip LED chip and the light intensity of the light at the four sides of the flip LED chip can be reduced, thus improving the uniformity of the color of the light. As compared with the LED bulbs known to the inventor, in the LED chip module manufactured by the aforementioned method, not only the packaging of the LEDs can be omitted, but also the LED bracket can be omitted. Hence, not only the production efficiency of the LED chip module can be increased, but also the production costs of the LED chip module can be reduced. The manufacturing process of the LED chip module is fast, simple, and can be achieved in mass production. The production efficiency of the LED chip module is high, and the production costs of the LED chip module are low.

According to a flip LED chip of an embodiment of the present disclosure, the flip LED chip comprises a chip body and pads on a bottom portion of the chip body. The pads comprise an N electrode pad and a P electrode pad. The bottom portion of the chip body is provided with two pad slots recessed upwardly, the N electrode pad is disposed on a bottom of one of the two pad slots, the P electrode pad is disposed on a bottom of the other of the two pad slots, and a gap is between a side surface of each of the pads and a side wall of a corresponding pad slot of the two pad slots. Therefore, upon soldering the flip LED chip on the wiring board, the melted solder paste can penetrate the gap and bond to the side surface of the pad. Therefore, the bonding between the solder paste and the pad can be achieved more sufficiently, thereby improving the reliability of soldering the flip LED chip with the wiring board. Hence, the production yield of the flip LED chip can be apparently improved.

Moreover, according to an LED pad printing screen of an embodiment of the present disclosure, the LED pad printing screen comprises a printing screen, and the printing screen is a plate of a block shape. The plate has a plurality of through holes defined through an upper surface of the plate and a lower surface of the plate, and a hole diameter of each of the through holes gradually increases along a direction from the upper surface of the plate to the lower surface of the plate. A position of the through hole corresponds to a position of the LED pad of the LED substrate. Therefore, by configuring the through hole of the printing screen to have a wider bottom and a narrower top, the issues of the insufficient demolding of glues or solder pastes from the printing screen can be greatly prevented. Therefore, the success rate of the assembling of the LED chips can be increased, thereby improving the production yield of the LED pad.

Because the colors of the light emitted from the front surface and side surfaces of each of the LED chips of the LED chip module are uniform, the overall production yield of the LED chip module can be increased, so that the color of the light of the LED device manufactured by the LED chip module can be more uniform, thus improving the quality of the LED device and the user satisfaction.

Other features and corresponding beneficial effects of the present disclosure are described later in the specification, and it is understood that at least some of the beneficial effects become apparent from the specification of the present disclosure.

BRIEF DESCRIPTION OF THE DRAWINGS

The present invention will become more readily apparent to those ordinarily skilled in the art after reviewing the following detailed description and accompanying drawings, in which:

FIG. 7 illustrates a schematic view showing that a glue layer is cut in accordance with an embodiment of the present disclosure;

FIG. 8 illustrates a schematic view showing that an adhesive layer is removed in accordance with an embodiment of the present disclosure;

FIG. 9 illustrates a schematic view (1) showing the structure of an LED chip module in accordance with an embodiment of the present disclosure;

FIG. 10 illustrates a cross-sectional view of the LED chip module along line A-A shown in FIG. 9;

DETAILED DESCRIPTION

In order to make the object, technical solutions, and advantages of the present disclosure more clearly understood, the following embodiments of the present disclosure are described in further detail by ways of specific embodiments in conjunction with the accompanying drawings. It should be understood that the specific embodiments described herein are intended only to explain the present disclosure and are not intended to limit it.

Figure 1:
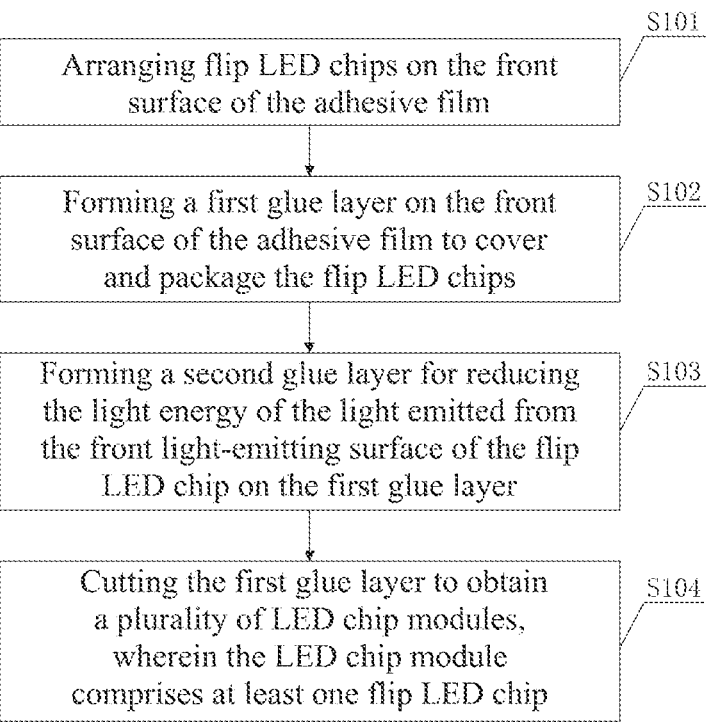
FIG. 1 illustrates a flowchart of a method for manufacturing LED chip module in accordance with an embodiment of the present disclosure.

FIG. 1 illustrates a flowchart of a method for manufacturing LED chip module in accordance with an embodiment of the present disclosure. In this embodiment, a method for manufacturing LED chip module is provided. At least parts of the front light-emitting surface of the flip LED chip of the manufactured LED chip module are covered with a second glue layer for reducing light energy. Hence, the difference between the light intensity of the light along the normal direction of the flip LED chip and the light intensity of the light at the four sides of the flip LED chip can be reduced, thus improving the uniformity of the color of the light.

For the sake of understanding, please refer to FIG. 1. In this embodiment, the method for manufacturing LED chip module comprises: step S101: arranging flip LED chips on the front surface of the adhesive film, and adhering the positive electrode and the negative electrode of each of the flip LED chips on the front surface of the adhesive film.

It is understood that, the type of the adhesive film of this embodiment can be flexibly varied. For example, the adhesive film may be, but not limited to, a UV release adhesive film or a thermosetting release adhesive film.

In some embodiments, the back surface of the adhesive film is also provided with an adhesive layer. In these embodiments, the adhesive film is adhered on a chip transfer platform through the adhesive layer on the back surface of the adhesive film. Then, the flip LED chips are arranged on the front surface of the adhesive film through the chip transfer platform. The chip transfer platform may be, but not limited to, a die bonder device or a chip arrangement device.

In some other embodiments, the back surface of the adhesive film is not provided with the adhesive layer. In these embodiments, the adhesive film is fixed on the chip transfer platform through vacuum suction or the like. Then, the flip LED chips are arranged on the front surface of the adhesive film through the chip transfer platform.

The flip LED chip adopted in the step S101 may be, but not limited to, a micro LED chip or a mini LED chip.

The flip LED chip adopted in the step S101 may be, but not limited to, a chip in which the bottom portion of the chip body is provided with pads. The bottom portion of the chip body is provided with two pad slots recessed upwardly. The N electrode pad of the chip is disposed on a bottom of one of the two pad slots, the P electrode pad of the chip is disposed on a bottom of the other of the two pad slots, and a gap is between a side surface of each of the pads and a side wall of a corresponding pad slot of the two pad slots. Therefore, upon soldering the flip LED chip on the wiring board, the melted solder paste can penetrate the gap and bond to the side surface of the pad. Therefore, the bonding between the solder paste and the pad can be achieved more sufficiently, thereby improving the reliability of soldering the flip LED chip with the wiring board.

Figures 2, 3, 4, 5:
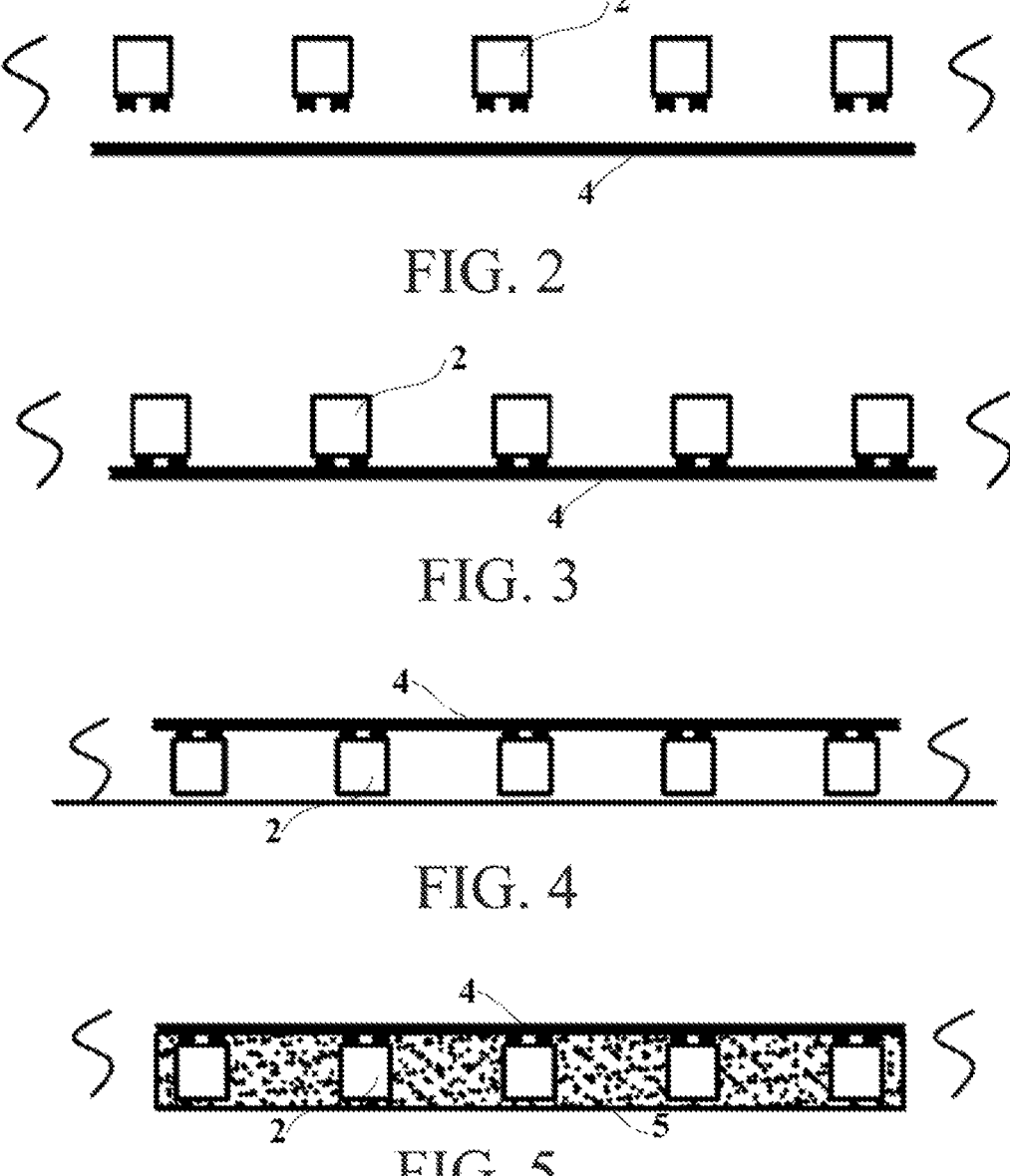
FIG. 2 illustrates a schematic view (1) showing that LED chips in accordance with an embodiment of the present disclosure are arranged on an adhesive film.
FIG. 3 illustrates a schematic view (2) showing that LED chips in accordance with an embodiment of the present disclosure are arranged on an adhesive film.
FIG. 4 illustrates a schematic view (1) showing that a glue layer is applied on an adhesive film through molding in accordance with an embodiment of the present disclosure.
FIG. 5 illustrates a schematic view (2) showing that a glue layer is applied on an adhesive film through molding in accordance with an embodiment of the present disclosure.

FIG. 2 and FIG. 3 illustrate an embodiment of the process for arranging flip LED chips on the front surface of the adhesive film. As shown in FIG. 2 and FIG. 3, according to the arrangement of the chip electrode pads on the substrate, correspondingly, the flip LED chips 2 are sequentially arranged on the front surface of the adhesive film 4.

Step S102: forming a first glue layer on the front surface of the adhesive film to cover and package the flip LED chips.

It is understood that, the way for forming the first glue layer on the front surface of the adhesive to cover and package the flip LED chips can be flexibly varied. For example, in one embodiment, by using a molding machine and a corresponding mold, a glue body is molded on the peripheral portions of the flip LED chips which are arranged on the front surface of the adhesive film. After molding, the semi-product can be baked or not according to the characteristics of the adopted glue body. For example, in another embodiment, by using glue-dispensing techniques, the first glue layer is formed on the peripheral portions of the flip LED chips which are arranged on the front surface of the adhesive film, and the semi-product is baked to obtain the first glue layer.

FIG. 4 to FIG. 6A illustrate an embodiment of the process for forming the first glue layer on the front surface of the adhesive film to cover and package the flip LED chips. As shown in FIG. 4 to FIG. 6A, the first glue layer 5 is molded on portions of front surface of the adhesive film 4 corresponding to the flip LED chips, and the formed first glue layer 5 can be refer to FIG. 5 and FIG. 6A.

Step S103: forming a second glue layer for reducing the light energy of the light emitted from the front light-emitting surface of the flip LED chip on the first glue layer, wherein the second glue layer covers at least parts of the front light-emitting surface of the flip LED chip and does not cover a portion of the first glue layer adjacent to the flip LED chip.

Figures 6A, 6B, 6C, 6D:
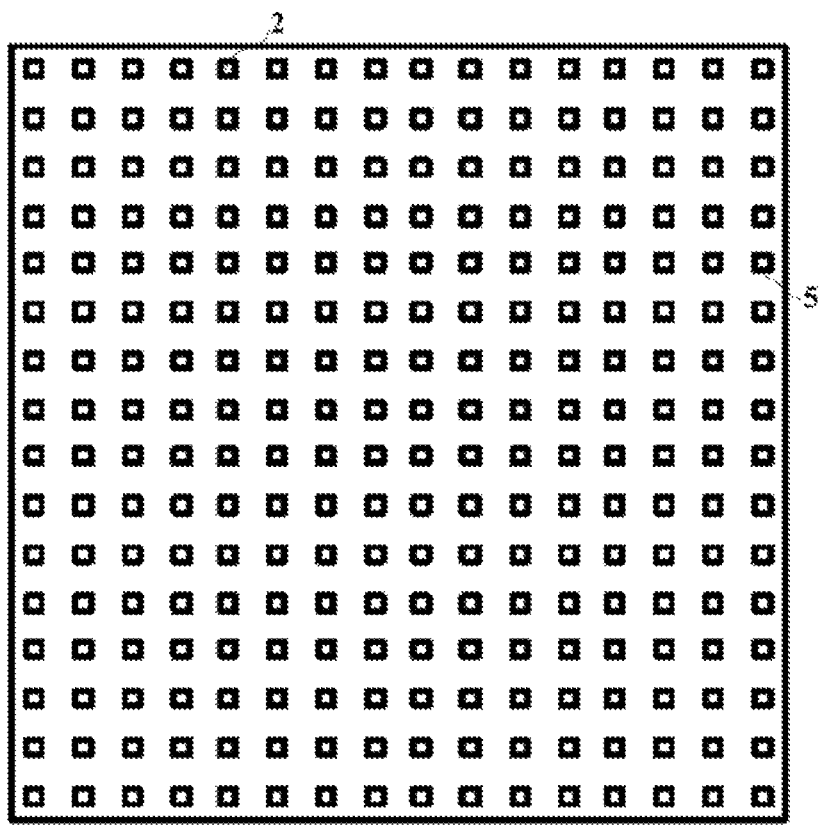
FIG. 6A illustrates a schematic view (3) showing that a glue layer is applied on an adhesive film through molding in accordance with an embodiment of the present disclosure.
FIG. 6B illustrates a schematic view (1) showing that a second glue layer is formed on a first glue layer in accordance with an embodiment of the present disclosure.
FIG. 6C illustrates a schematic view (2) showing that a second glue layer is formed on a first glue layer in accordance with an embodiment of the present disclosure.
FIG. 6D illustrates a schematic view (3) showing that a second glue layer is formed on a first glue layer in accordance with an embodiment of the present disclosure.

It is understood that, the way for forming the second glue layer for reducing the light energy of the light emitted from the front light-emitting surface of the flip LED chip on the first glue layer can be flexibly varied. For example, in one embodiment, by using printing or glue-dispensing techniques, the second glue layer is formed right above the portion of the first glue layer corresponding to the flip LED chip (that is, right above the front light-emitting surface of the flip LED chip). Moreover, optionally, after the drying process, the LED chip can be tested. If the LED chip passes the test, following steps are executed; if the LED chip does not pass the test, the procedure is redone again. FIG. 6B illustrates a schematic view showing that the second glue layer 8 is formed on the first glue layer 5 in accordance with an embodiment of the present disclosure. In some embodiments, the second glue layer completely covers the front light-emitting surface of the LED chip, and an area of the second glue layer corresponds to an area of the front light-emitting surface of the LED chip. Here, the sentence "an area of the second glue layer corresponds to an area of the front light-emitting surface of the LED chip" indicates that the area of the second glue layer is the same as the area of the front light-emitting surface of the LED chip (for example, as shown in FIG. 6C), or slightly greater than the area of the front light-emitting surface of the LED chip (for example, as shown in FIG. 6B), or slightly less than the area of the front light-emitting surface of the LED chip (for example, as shown in FIG. 6D).

In one embodiment, the upper surface of the second glue layer is a flat surface (for example, as shown in FIG. 6C and FIG. 6D). In the case that the upper surface of the second glue layer is a flat surface, not only the processing of the second glue layer is convenient, but also the mounting of the LED chip modules and the consistent controlling of the LED chip modules are convenient. Moreover, optionally, an interface between the second glue layer and the first glue layer is a flat surface. Of course, in some application scenarios, the interface between the second glue layer and the first glue layer is a curved surface or other irregular surfaces according to practical requirements.

Step S104: cutting the first glue layer to obtain a plurality of LED chip modules, wherein the LED chip module comprises at least one flip LED chip.

In this embodiment, upon cutting the first glue layer, the number and the arrangement of the chips in the cut LED chip module can be confirmed in advance. Then, the first glue layer is cut according to the confirmed arrangement, where the cutting procedure is performed by cutting the first glue layer containing at least one flip LED chip as a module block to obtain a corresponding LED chip module. At least parts of the front light-emitting surface of the flip LED chip of the obtained LED chip module are covered with the second glue layer for reducing light energy. Therefore, the difference between the light intensity of the light along the normal direction of the flip LED chip and the light intensity of the light at the four sides of the flip LED chip can be reduced, thus improving the uniformity of the color of the light. In some embodiments, the second glue layer may reduce the difference between the light intensity of the light along the normal direction of the flip LED chip and the light intensity of the light at the four sides of the flip LED chip through, for example but not limited thereto, at least one of reflection, refraction, and scattering, thus allowing the colors of the light right on the chip and around the chip to be uniform.

[The First Glue Layer and the Second Glue Layer]

In some embodiments, the first glue layer (which covers and packages each of the flip LED chips) and the second glue layer in the LED chip module can be directly served as the packaging glue layer. Therefore, after the LED chip module is bonded on the substrate, a step of providing the packaging glue can be omitted, thereby further improving the product manufacturing efficiency and simplifying the product manufacturing process. In some embodiments, the surface of the first glue layer on the front light-emitting surface of the flip LED chip may be a flat surface. In some other embodiments, the surface of the first glue layer on the front light-emitting surface of the flip LED chip may be curved surface, correspondingly, the second glue layer may be a curved surface. Moreover, according to practical requirements, the curved surface may be an upwardly-protruding curved surface or a downwardly-recessed curved surface.

Moreover, it is understood that, the material of the first glue layer may be flexibly varied. For example, the material of the first glue layer may be epoxy, resin, silicone, or UV glue. In this embodiment, the configuration of the first glue layer may be flexibly varied according to the color of the light to be emitted from the LED chip module. For example, in one embodiment, in the case that the LED chip module is a blue-light LED chip module, the first glue layer may be, but not limited to, a transparent glue layer, a white glue layer, or a semi-transparent glue layer. In another embodiment, in the case that the LED chip module is a white-light LED chip module, the first glue layer may be a white glue layer, a semi-transparent glue layer, or a light conversion glue layer. The white glue may be obtained, but not limited to, by increasing corresponding amounts of white silicon dioxide or titanium dioxide in the transparent glue (which may be epoxy, resin, silicone, or UV glue), the semi-transparent glue may be obtained, but not limited to, by increasing less than 1% of white silicon dioxide or titanium dioxide in the transparent glue (which may be epoxy, resin, silicone, or UV glue), and the light conversion glue layer may be a fluorescent glue layer or a quantum dot film glue layer.

In some embodiments, the second glue layer may be a white glue layer or a semi-transparent layer which comprise scattering particles, or the second glue layer may be a light conversion glue layer for absorbing blue light. The scattering particles may be, but not limited to, silicon dioxide or titanium dioxide. The light conversion glue layer may be, but not limited to, a fluorescent glue layer or a quantum dot film glue layer.

For example, in one application scenario, the first glue layer may be a first transparent glue layer, a first white glue layer, or a first semi-transparent glue layer, and the second glue layer may be a second semi-transparent glue layer (the medium of the second semi-transparent glue layer and the first semi-transparent glue layer may be different). The light emitted from the front surface of the LED chip passes through the first glue layer and enters the second glue layer, and at least one of refraction and reflection of light occurs at the second glue layer. Moreover, optionally, according to practical requirements, scattering particles may be added into the second semi-transparent glue layer. Under such configuration, scattering may also occur to the light in the second semi-transparent glue layer. After the light is refracted or scattered by passing through the second semi-transparent glue layer, more light energy can be provided above the portions between the LED chips. The light is then reflected by the second semi-transparent glue layer and reenters the first glue layer, so that the difference between the light intensity of the light along the normal direction of the flip LED chip and the light intensity of the light at the four sides of the flip LED chip can be reduced.

In another application scenario, the first glue layer may be a first transparent glue layer, a first white glue layer, or a first semi-transparent glue layer, and the second glue layer may be a second white glue layer (the medium of the second white glue layer and the first white glue layer may be different). After the light is refracted by passing through the second semi-transparent glue layer, more light energy can be provided above the portions between the LED chips. The light is then reflected by the second white glue layer and reenters the first glue layer, so that the difference between the light intensity of the light along the normal direction of the flip LED chip and the light intensity of the light at the four sides of the flip LED chip can be reduced.

[The Arrangement of the LED Chips]

In some embodiments, the cutting procedure is performed by cutting the first glue layer containing at least two flip LED chips as a module block. In this embodiment, in the step S101, according to the arrangement of the chip electrode pads on the substrate, correspondingly, the flip LED chips are arranged on the front surface of the adhesive film, and the positive electrode and the negative electrode of each of the flip LED chips are adhered to the front surface of the adhesive film. Under such configuration, the LED chip module comprises at least two micro LED chips or mini LED chips (it is understood that, the LED chip may be also of a normal size or a larger size). Therefore, upon the die-bonding procedure of the LED chips, several LED chips can be transferred to corresponding positions of the substrate in a one-time step, by directly taking the LED chip module as an unit. Moreover, because the flip LED chips of the LED chip module are correspondingly arranged according to the arrangement of the chip electrode pads on the substrate, after the LED chip module is transferred to the substrate, the positive electrode and the negative electrode of each of the LED chips of the LED chip module can be ensured to be electrically connected to the corresponding chip electrode pads. Hence, not only the efficiency of the die bonding procedure can be increased by multiple times, but also the accuracy and reliability of the die bonding procedure can be guaranteed. Accordingly, the reliability of the product quality of the LED device with the LED chip module can be ensured. Moreover, as compared with the LED bulbs known to the inventor, in the LED chip module manufactured by the aforementioned method, not only the packaging of the LEDs can be omitted, but also the LED bracket can be omitted. Hence, not only the production efficiency of the LED chip module can be increased, but also the production costs of the LED chip module can be reduced. Furthermore, because the colors of the light emitted from the front surface and side surfaces of each of the LED chips of the LED chip module are uniform, the overall production yield of the LED chip module can be increased, so that the color of the light of the LED device manufactured by the LED chip module can be more uniform, thus improving the quality of the LED device and the user satisfaction.

In this embodiment, the arrangement of the chip electrode pads on the substrate may comprise, but not limited to, the positions of the chip electrode pads and the spacing between adjacent chip electrode pads.

It is understood that, in this embodiment, the number of the LED chip contained in one LED chip module may be flexibly configured according to practical application scenarios; correspondingly, the arrangement of the chip electrode pads on the substrate and the connection manner of the LED chips of the LED chip module on the substrate may be flexibly configured according to practical application scenarios. For example, the connection of the LED chips of the LED chip module on the substrate may be series connection, parallel connection, or series-parallel connection. Furthermore, the material of the substrate may be flexibly varied.

For example, the material of the substrate may be, but not limited to, glass, BT (a thermosetting resin formed by using bismaleimide (BMI) and triazine as the major components and epoxy resin, polyphenylene ether (PPE) resin, or allyl compounds as modified components), or glass fiber. In some embodiments, the LED chip module can be utilized for manufacturing light bars or other lighting products. Under such configuration, the substrate is a flexible substrate which may be, but not limited to, a flexible circuit board. In this embodiment, the chip electrode pad may be formed on the substrate through any of the aforementioned ways, and the formation of the chip electrode pad is not iterated.

As mentioned above, the number of the LED chips contained in one LED chip module may be flexibly configured according to practical application scenarios. Moreover, it is understood that, the number of the LED chips of each of the LED chip modules in one substrate may be the same, or the number of the LED chips of at least some of the LED chip modules in one substrate may be different from the other LED chip modules in the same substrate, and the number of the LED chips of the LED chip module can be flexibly configured according to practical requirements. For the sake of understanding, several conditions of the LED chips in one LED chip module are provided with embodiments.

In one embodiment, the LED chip module comprises N*N flip LED chips, and the N*N flip LED chips are arranged as an N*N array, where N is an integer equal to or greater than 2. Moreover, it is understood that, the value of N may be configured flexibly according to actual requirements, for example, may be 2, 3, 4, 5, 6, or the like. Under such configuration, upon performing the die bonding procedure with the LED chip module, the die-bonding efficiency of the LED chip module will be N*N times of the efficiency of a single LED chip. A schematic view showing the cutting of the module block can be referred to FIG. 7.

In another embodiment, the LED chip module comprises N*M flip LED chips, and the N*M flip LED chips are arranged as an M*N array, where N is an integer equal to or greater than 2, M is an integer equal to or greater than 1, and M and N have different values. It is understood that, the values of N and M may be configured flexibly according to actual requirements, for example, N may be 2, 3, 4, 5, 6, or the like, and M may be 1, 2, 3, 4, 5, 6, or the like. Under such configuration, upon performing the die bonding procedure with the LED chip module, the die-bonding efficiency of the LED chip module will be M*N times of the efficiency of a single LED chip.

Of course, it is understood that, no matter the flip LED chips in the LED chip module is arranged as an N*M array or an N*N array, the arrangement of the flip LED chips (including the positions of the flip LED chips and the spacing between adjacent flip LED chips. Moreover, it is understood that, in this embodiment, the arrangement of the flip LED chips of the LED chip module is not limited to regular array arrangements and may be configured as irregular arrangements according to actual application scenarios.

Moreover, it is understood that, in this embodiment, the LED device may be, but not limited to, COB (a chip on board) lighting device (such as a COB light bar or a COB light) or a display light source device (such as a backlight source or a display device with a direct light source).

For the sake of understanding, in the following paragraphs, several practical LED chip modules are provided with embodiments.

Figure 11:
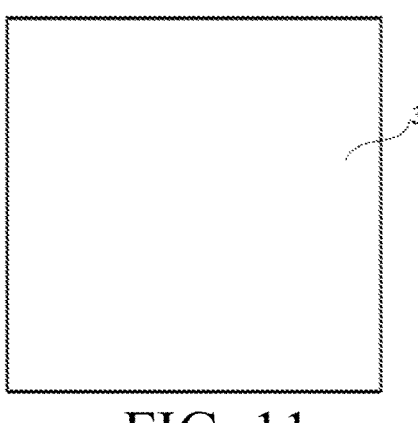
FIG. 11 illustrates a schematic view (2) showing the structure of an LED chip module in accordance with an embodiment of the present disclosure.
Figure 12:
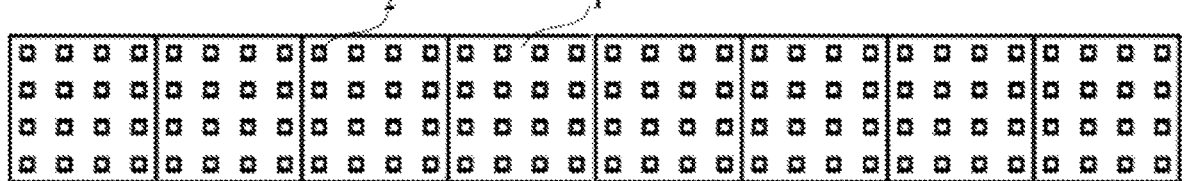
FIG. 12 illustrates a schematic view of the LED chip modules shown in FIG. 9 are mounted.

Please refer to the LED chip module shown in FIG. 9. The LED chip module shown in FIG. 9 comprises 4*4 flip LED chips 2 and a first glue layer covering the flip LED chips 2. The LED chip module shown in FIG. 9 may be a blue-light LED chip module. The first glue layer may comprise a first transparent glue layer 1 and a second glue layer 8 on the first glue layer 1. As shown in FIG. 10, which illustrates a cross-sectional view along line A-A shown in FIG. 9. The arrangement of the flip LED chips 2 of the LED chip module corresponds to the chip electrode pads on the substrate. The positive electrode and the negative electrode of the LED chip 2 are exposed out of the first glue layer, so that the positive electrode and the negative electrode of the LED chip 2 are electrically connected to corresponding chip electrode pads on the substrate. Upon manufacturing the LED device with the LED chip module, die-bonding procedures can be performed by taking the LED chip module as a unit and mounting the unit on the substrate. A schematic view showing the result of the die-bonding procedure can be referred to FIG. 12. Under this configuration, the die-bonding efficiency of the LED chip module is 16 times of the die-bonding efficiency of the single flip LED chip. Of course, the first transparent glue layer 1 shown in FIG. 9 may be replaced by the first glue layer 3 shown in FIG. 11 with the second glue layer being optionally omitted. Furthermore, it is understood that, according to one or some embodiments of the present disclosure, the first transparent glue layer 1 in following figures can be replaced by the first white glue layer or the first semi-transparent glue layer. The LED chip modules shown in FIG. 9 and FIG. 11 comprise 4*4 flip LED chips, and the flip LED chips are arranged as a 4*4 array.

Figure 13:
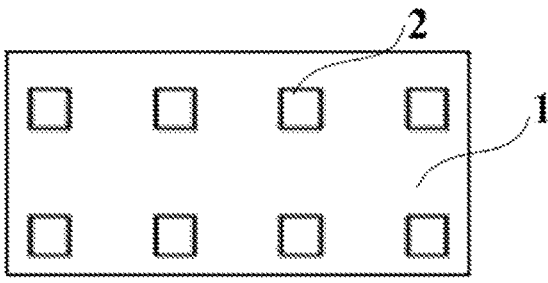
FIG. 13 illustrates a schematic view (3) showing the structure of an LED chip module in accordance with an embodiment of the present disclosure.
Figure 14:
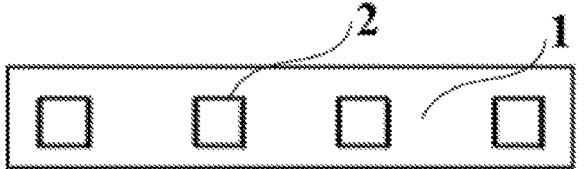
FIG. 14 illustrates a schematic view (4) showing the structure of an LED chip module in accordance with an embodiment of the present disclosure.

Please refer to the LED chip module shown in FIG. 13. The LED chip module shown in FIG. 13 comprises 2*4 flip LED chips 2 and a first glue layer covering the flip LED chips 2. The LED chip module shown in FIG. 13 may be a blue-light LED chip module. The first glue layer may comprise a first transparent glue layer 1. The arrangement of the flip LED chips 2 of the LED chip module corresponds to the chip electrode pads on the substrate. The positive electrode and the negative electrode of the LED chip 2 are exposed out of the first glue layer, so that the positive electrode and the negative electrode of the LED chip 2 are electrically connected to corresponding chip electrode pads on the substrate. Upon manufacturing the LED device with the LED chip module, die-bonding procedures can be performed by taking the LED chip module as a unit and mounting the unit on the substrate. Under this configuration, the die-bonding efficiency of the LED chip module is 8 times of the die-bonding efficiency of the single flip LED chip. The LED chip module shown in FIG. 13 comprises 2*4 flip LED chips, where the flip LED chips are also arranged as an M*N array. In some application scenarios, for example, in the case that the LED chip module is provided for manufacturing light bars, the chips in the LED chip module may be arranged as a 1*N array, such as the LED chip module shown in FIG. 14.

Figure 15:
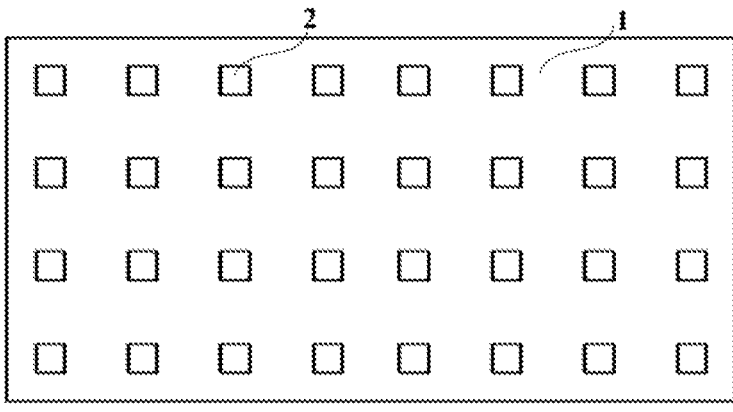
FIG. 15 illustrates a schematic view (5) showing the structure of an LED chip module in accordance with an embodiment of the present disclosure.
Figure 16:
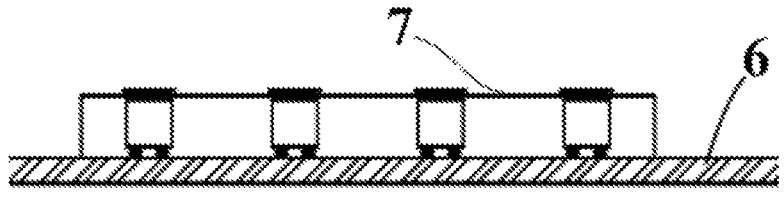
FIG. 16 illustrates a schematic view showing LED chip modules are transferred to the substrate in accordance with an embodiment of the present disclosure.
Figure 17:
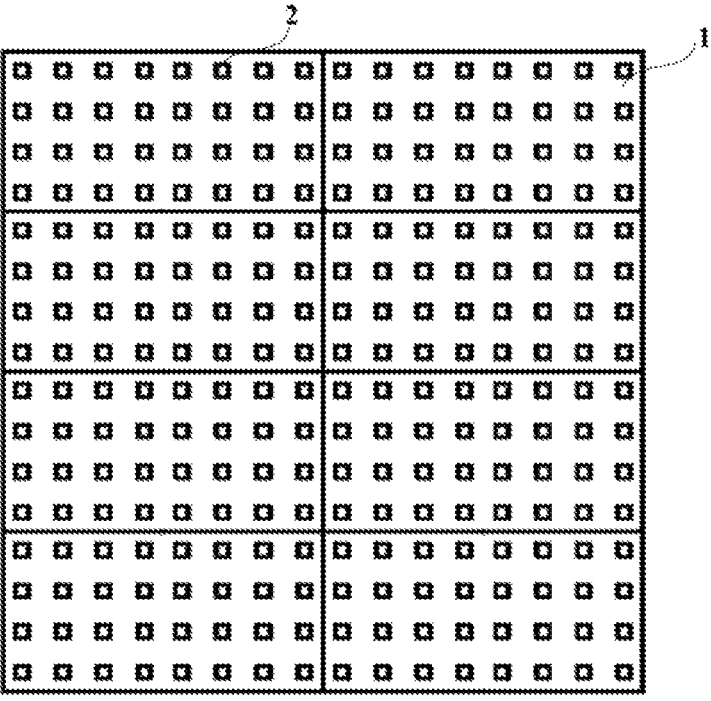
FIG. 17 illustrates a schematic view of the LED chip modules shown in FIG. 15 are mounted.

In some application scenarios, the number of the flip LED chips of the LED chip module may increase according to requirements. For example, as shown in FIG. 15, the LED chip comprises 4*8 flip LED chips 2 and a first glue layer covering the flip LED chips 2. The LED chip module shown in FIG. 15 may be a blue-light LED chip module. The first glue layer may comprise a first transparent glue layer 1 and a second glue layer 8 on the first glue layer 1. The arrangement of the flip LED chips 2 of the LED chip module corresponds to the chip electrode pads on the substrate. The positive electrode and the negative electrode of the LED chip 2 are exposed out of the first glue layer, so that the positive electrode and the negative electrode of the LED chip 2 are electrically connected to corresponding chip electrode pads on the substrate. Upon manufacturing the LED device with the LED chip module, die-bonding procedures can be performed by taking the LED chip module as a unit and mounting the unit on the substrate. For example, as shown in FIG. 16, the LED chip module 7 is transferred and mounted on the substrate 6. Under this configuration, the die-bonding efficiency of the LED chip module is 32 times of the die-bonding efficiency of the single flip LED chip. A schematic view showing the result of the die-bonding procedure can be referred to FIG. 17.

Therefore, the LED chip module and the LED device according to one or some embodiments of the present disclosure, as compared with a single LED chip, the die-bonding efficiency of the LED chip can be increased by multiple times. Hence, the adhesiveness and the conductivity of the silver glue and solder paste which are printed on the pads of the substrate can be prevented from being worsen owing to a longer die-bonding time. Therefore, the quality and reliability of the LED device product can be improved.

[The Adhesive Film]

In this embodiment, the type of the adhesive film may be flexibly configured. For example, the adhesive film may be, but not limited to, a UV release adhesive film or a thermo-setting release adhesive film.

In some embodiments, the back surface of the adhesive film is also provided with an adhesive layer. In these embodiments, the adhesive film is adhered on a chip transfer platform through the adhesive layer on the back surface of the adhesive film. Then, the flip LED chips are arranged on the front surface of the adhesive film through the chip transfer platform. The chip transfer platform may be, but not limited to, a die bonder device or a chip arrangement device.

In some embodiments, after forming the first glue layer on the front surface of the adhesive film to cover and package the flip LED chips, the adhesive film may be removed for subsequent use of the LED chip module. Of course, in some application scenarios, the adhesive film is not removed right after the formation of the first glue layer; instead, the adhesive film is removed upon the LED chip module is to be utilized.

In this embodiment, for removing the adhesive film, the step of removing the entire adhesive film may be performed after forming the first glue layer on the front surface of the adhesive film to cover and package the flip LED chips but before cutting the first glue layer. Alternatively, in another embodiment, the step of removing the adhesive film may be performed after cutting the first glue layer. Under such condition, upon cutting the first glue layer, the adhesive film may not be cut off and thus the entire adhesive film can be removed in a one-time step. Alternatively, in another embodiment, the adhesive film is cut off upon cutting the first glue layer, and the adhesive films on each of the LED chip modules is sequentially removed. After removing the adhesive film, the positive electrode and the negative electrode of the flip LED chip are exposed out of the first glue layer.

In one embodiment, in the case that the adhesive film is a UV release adhesive film or a thermosetting release adhesive film, removing the adhesive film may be, but not limited to, achieved through UV illumination or baking to reduce the adhesiveness of the adhesive film, so that the adhesive film can be detached from the flip LED chips and the glue layer. Hence, the removing of the adhesive film is convenient and fast. A schematic view showing the adhesive film is removed can be referred to FIG. 8. As compared to FIG. 6B, in FIG. 8, the adhesive film 4 is removed.

In one embodiment, a method for manufacturing LED device is further provided. The method comprises: manufacturing an LED chip module by using the aforementioned manufacturing method; and transferring the LED chip module to the substrate and electrically connecting the positive electrode and the negative electrode of each of the LED chips of the LED chip module to corresponding chip electrode pads on the substrate. In some embodiments, the LED chip modules may be placed on the substrate through, for example, but not limited to, a die bonder device or a mass transfer function, and the electrodes of each of the flip LED chips of the LED chip modules correspond to the corresponding chip electrode pads of the substrate.

In some application scenarios, the chip electrode pads of the substrate may be printed with conductive pastes such as silver glue or solder paste in advance, and then the LED chip modules are placed on the substrate through the die bonder device or the mass transfer function. In some other application scenarios, if the flip LED chips are already provided with solder material(s), then it is not necessary to print conductive pastes such as silver glue or solder paste on the chip electrode pads of the substrate.

[The Structure of the LED Chip]

According to one or some embodiments of the present disclosure, the flip LED chip may be, but not limited to, a micro LED chip or a mini LED chip, and the color of the light emitted by the LED chip is not limited, so that the LED chip may be a blue-light chip, a UV-light chip, or a red-light chip. To increase the production yield of the whole LED chip module, an LED chip is provided. Therefore, the issues that the soldered flip LED chip is detached from the wiring board very easily owing to the insufficient contact area between the solder paste and the pad can be solved, and the LED chip module can be manufactured much smaller and thinner.

Figure 18A:
FIG. 18*a* illustrates a schematic view showing the structure of a first type of a flip LED chip in accordance with an embodiment A of the present disclosure.
Figure 18A:
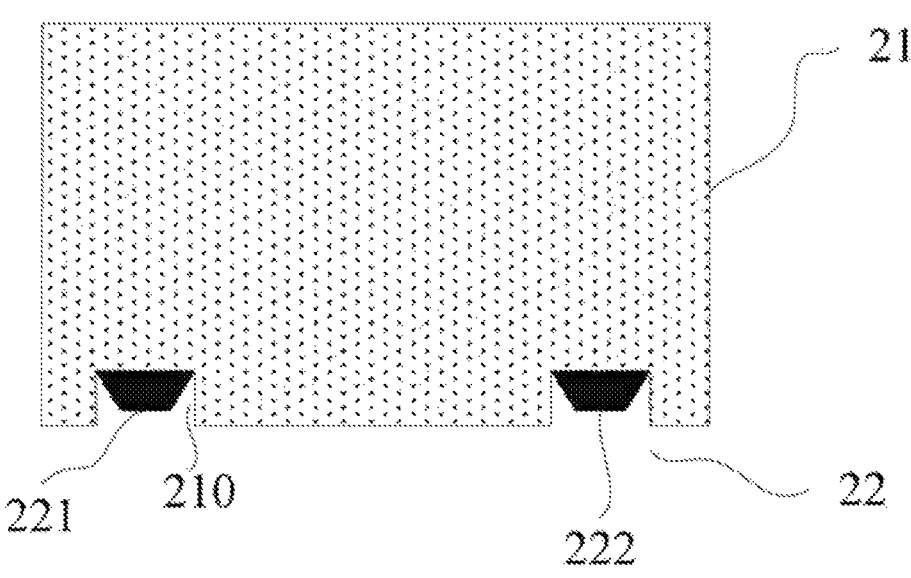

Please refer to FIG. 18a. FIG. 18a illustrates a schematic view showing the structure of a flip LED chip. The flip LED chip 20 comprises a chip body 21 and pads 22 on the bottom portion of the chip body 21. The chip body 21 may comprise an N-type current spreading layer and a P-type current spreading layer, and an intersection between the N-type current spreading layer and the P-type current spreading layer forms a P-N junction. Of course, the chip body 21 may comprise a transparent protection layer and a light-emitting layer. The pads 22 comprise an N electrode pad 221 and a P electrode pad 222, and the N electrode pad 221 and the P electrode pad 222 are isolated with each other through an isolation belt made of insulative material(s).

The pads 22 are disposed on the bottom portion of the chip body 21. For example, in FIG. 18a, the bottom portion of the chip body 21 is provided with two pad slots 210 recessed upwardly. The N electrode pad 221 and the P electrode pad 222 are respectively disposed on bottoms of the two pad slots 210, and a gap is between a side surface of the pad 22 and a side wall of the pad slot 210. Upon soldering the flip LED chip 20 on the wiring board with the solder paste, the melted solder paste can, not only bond to the bottom surface of the pad 22 but also penetrate the gap between the side surface of the pad 22 and the side wall of the pad slot 210, so that the solder paste, the side surface of the pad 22, and the side wall of the pad slot 210 can be bonded with each other. Accordingly, the contact area between the solder paste and the pad 22 can be increased, thereby improving the bonding between the solder paste and the pad 22 and the soldering reliability.

In some embodiments, the height h of the pad 22 is less than or equal to the depth d of the pad slot 210. Therefore, the pad 22 is in the pad slot 210. Because the pad 22 is disposed on the pad slot 210 which is recessed upwardly, the pad 22 can be considered as substantially "embedded" in the bottom portion of the chip body 21.

Figure 19A:
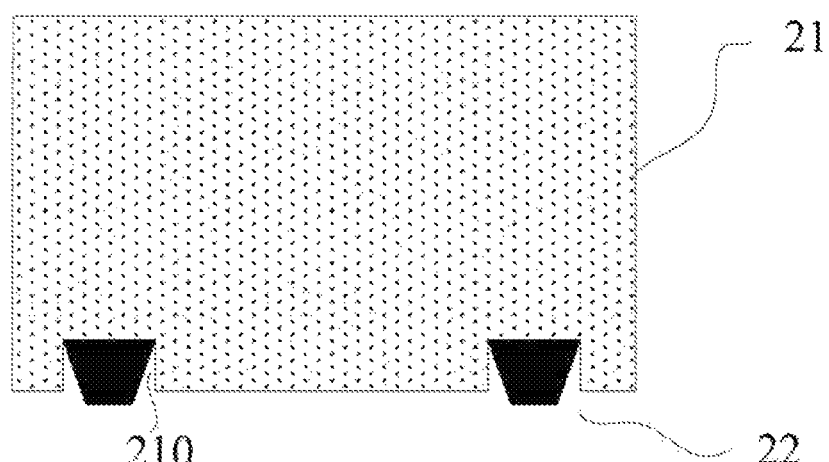
FIG. 19*a* illustrates a schematic view showing the structure of a third type of a flip LED chip in accordance with the embodiment A of the present disclosure.
Figure 19B:
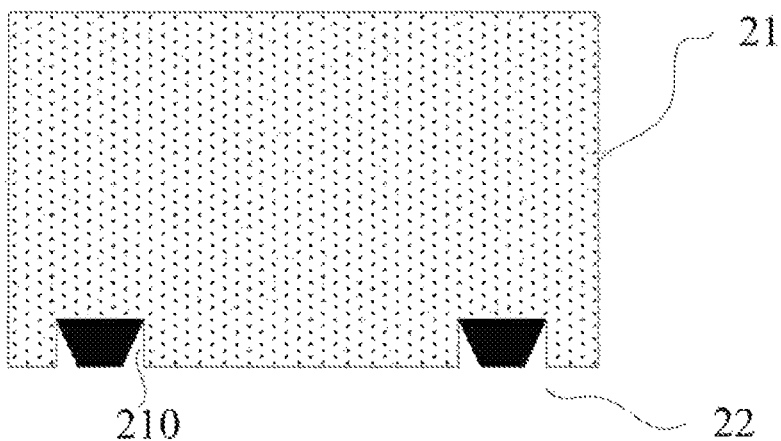
FIG. 19*b* illustrates a schematic view showing the structure of a fourth type of a flip LED chip in accordance with the embodiment A of the present disclosure.

In some embodiments, the pad 22 may extend out of the pad slot 210; that is, the depth of the pad slot 210 is less than the height of the pad 22. Optionally, in some embodiments, the value of h–d is less than or equal to 20 μm. It is understood that, when the value of h–d is less than or equal to 20 μm, h is less than or equal to d. However, in some embodiments, h may be slightly greater than d as long as the value of h–d does not exceed 20 μm. For example, in FIG. 19*a*, the pad 22 slightly extends out of the opening of the pad slot 210. However, in some embodiments, in general, the height of the pad 22 is less than or equal to the depth of the pad slot 210; for example, in FIG. 19*b*, the depth of the pad slot 210 is the same as the height of the pad 22, while in FIG. 18*a*, the height of the pad 22 is less than the depth of the pad slot 210. It is understood that, as compared to the condition that the height of the pad 22 is equal to or greater than the depth of the pad slot 210, during the soldering process, in the flip LED chip 20 shown in FIG. 18*a*, the solder paste will penetrate the gap between the side wall of the pad slot 210 and the side surface of the pad 22 more easily. Hence, configuring the pad 22 not protruding out of the pad slot 210 will facilitate in further improving the soldering reliability.

Figure 20:
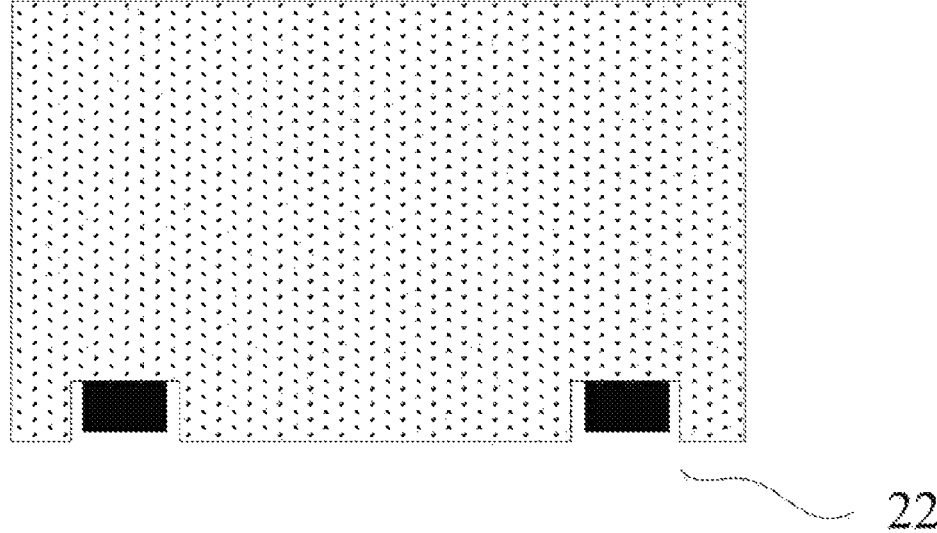
FIG. 20 illustrates a schematic view showing the structure of a fifth type of a flip LED chip in accordance with the embodiment A of the present disclosure.

In the flip LED chip according to some embodiments of the present disclosure, the shape of the longitudinal-sectional area of the pad 22 may be rectangular (for example, the flip LED chip shown in FIG. 20). Therefore, the pad 22 may be a cuboid, a cube, a prism, a cylinder, or the like. Under such configuration, the shapes and the areas of the cross-sectional areas at different portions of the pad 22 are the same. However, in some embodiments, as the flip LED chip shown in FIG. 18*a*, the cross-sectional areas at different portions of the pad 22 are not all the same. In FIG. 18*a*, the cross-sectional area of the pad 22 gradually decreases from the top to the bottom; that is, the cross-sectional area of the pad 22 gradually decreases from the bottom of the pad slot 210 to the opening of the pad slot 210 (which is distant from the bottom of the pad slot 210). The cross-sectional area of the pad 22 is of an inverse trapezoidal shape. In the flip LED chip, the side wall of the pad slot 210 is vertically configured (that is, the side wall of the pad slot 210 is perpendicular to the bottom surface of the chip body 21). Therefore, the gap between the pad slot 210 and the pad 22 gradually increases from the top to the bottom, and such configuration facilitates the entering of the solder paste. In FIG. 18*a*, the longitudinal-sectional area of the pad 22 is of an inverse isosceles trapezoidal shape. However, in some other embodiments, the longitudinal-sectional area of the pad 22 may be not of an inverse isosceles trapezoidal shape, but a normal trapezoidal shape.

Figure 18B:
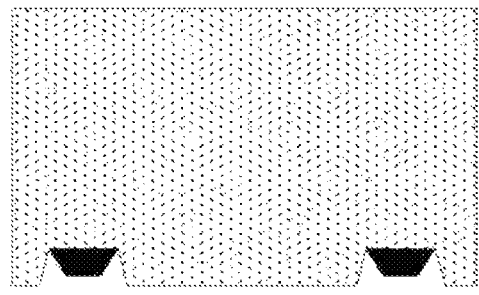
FIG. 18*b* illustrates a schematic view showing the structure of a second type of a flip LED chip in accordance with the embodiment A of the present disclosure.

In some embodiments, the side wall of the pad slot 210 may be not vertically configured. For example, FIG. 18*b* illustrates an LED chip, and in the LED chip, the cross-sectional area of the pad slot gradually increases from the bottom of the pad slot to the opening of the pad slot. In other words, in this embodiment, the side wall of the pad slot is inclined toward a direction away from the pad along the bottom of the pad slot to the opening of the pad slot.

Although in FIG. 18*b*, the pad is of an inverse trapezoidal shape, it is undoubted that, in some embodiments, the longitudinal-sectional area of the pad 22 may be of a rectangular shape, and the pad 22 may be a cuboid, a cube, a prism, a cylinder, or the like.

It is understood that, the improvement of the bonding between the solder paste and the pad can also be achieved by modifying the friction coefficient of the surface of the pad. Specifically, as compared to the pad with a rough surface, the pad with a smooth surface can be firmly bonded to the solder paste. In one aspect, the larger friction coefficient increases the friction force between the pad and the solder paste, and the bonding between the pad and the solder paste can be thus increased owing to the strong interaction force between the pad and the solder paste. In the other aspect, the increase of the friction coefficient indicates that the surface of the pad is not even; for example, a portion of the pad is recessed indicates that a corresponding portion of the solder paste is protruding, while a portion of the pad is protruding indicates that a corresponding portion of the solder paste is recessed. Under such configuration, the solidified solder paste and the pad can be "engaged" or "mated" with each other, so that the cut-off force between the pad and the solder paste can be increased. Therefore, in some embodiments, in order to allow the flip LED chip to be firmly soldered on the wiring board, the bottom portion of the pad is configured to have a greater friction coefficient. For example, the friction coefficient of the bottom portion of the pad may be greater than the friction coefficient of the current spreading layer which is integrally formed with the pad. For example, the friction coefficient of the bottom portion of the N electrode pad is greater than the friction coefficient of the N-type current spreading layer, and the friction coefficient of the bottom portion of the P electrode pad is greater than the friction coefficient of the P-type current spreading layer. In some embodiments, the friction coefficient of the bottom portion of the pad is greater than the friction coefficient of the N-type current spreading layer and the friction coefficient of the P-type current spreading layer.

Figure 21:
FIG. 21 illustrates a schematic view showing the structure of a sixth type of a flip LED chip in accordance with the embodiment A of the present disclosure.
Figure 21:
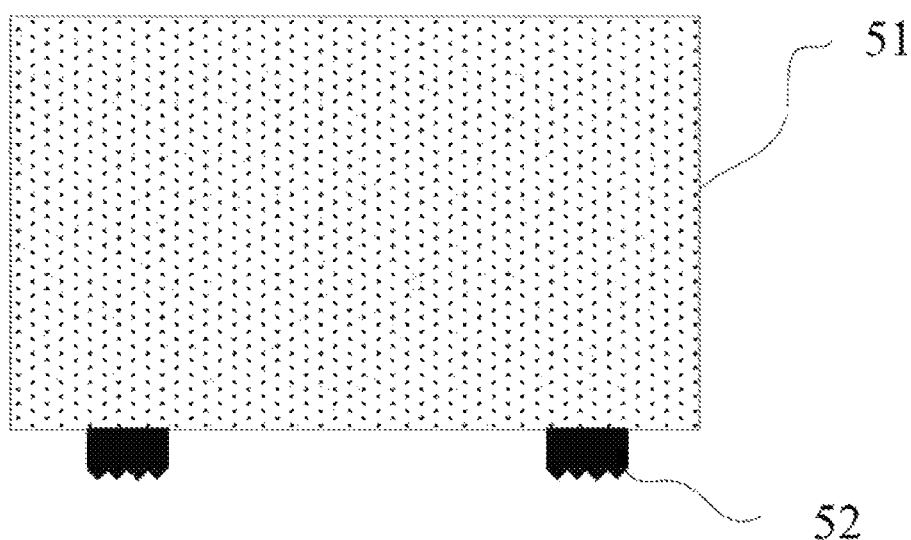
Figure 22:
FIG. 22 illustrates a schematic view of a pad in accordance with the embodiment A of the present disclosure.

Please refer to the structure of the flip LED chip shown in FIG. 21. In the flip LED chip 50 shown in FIG. 21, the configuration between the pad 52 and the chip body 51 is similar to the configuration of the flip LED chip 10 shown in FIG. 1. However, in FIG. 21, the bottom portion of the pad of the flip LED chip 50 is zigzag-shaped or wavy-shaped. It is understood that, in FIG. 21, the bottom surface of the pad 52 is of a triangular zigzag shape; however, in some other embodiments, the bottom surface of the pad 52 may be of a rectangular zigzag shape, or even a combination shape of the triangular zigzag shape and the rectangular zigzag shape, or a combination shape of a zigzag shape and a wavy shape. For example, another structure of the flip LED chip is shown in FIG. 22. Of course, in some embodiments, the zigzag shape of the bottom portion of the pad may have other shapes, and all possible examples are not iterated here.

In some embodiments, such configuration for increasing the friction coefficient of the surface of the pad can be applied to the flip LED chip. For example, in FIG. 23, in the flip LED chip 70, the bottom surface of the pad 72 is rough, and the friction coefficient of the bottom surface of the pad 72 is greater than the corresponding current spreading layer. Therefore, for the flip LED chip 70, not only the bonding between the pad 72 and the solder paste can be improved by allowing the solder paste to penetrate the gap between the pad 72 and the pad slot 710, but also the cut-off force between the pad 72 and the solder paste can be increased by the mating between the bottom zigzag-shaped surface of the pad 72 and the solder paste. Therefore, the reliability for soldering the flip LED chip 70 can be improved.

Figure 23:
FIG. 23 illustrates a schematic view showing the structure of a seventh type of a flip LED chip in accordance with the embodiment A of the present disclosure.
Figure 23:
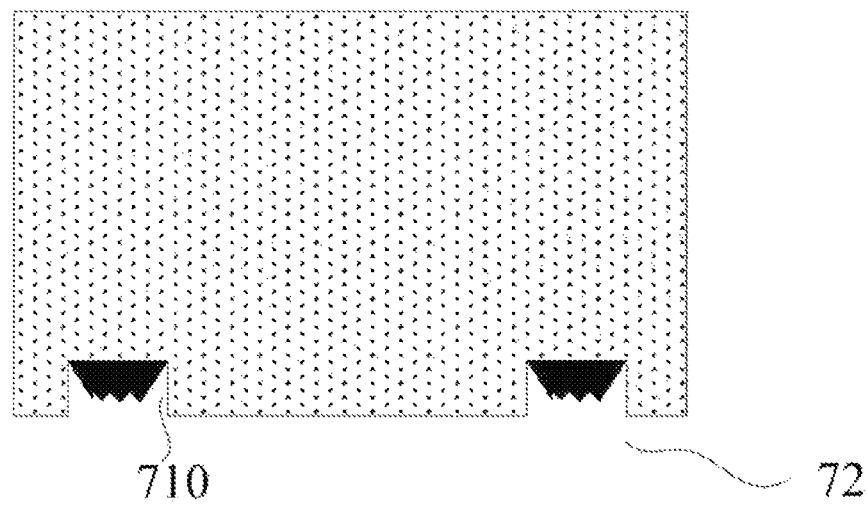
Figure 24:
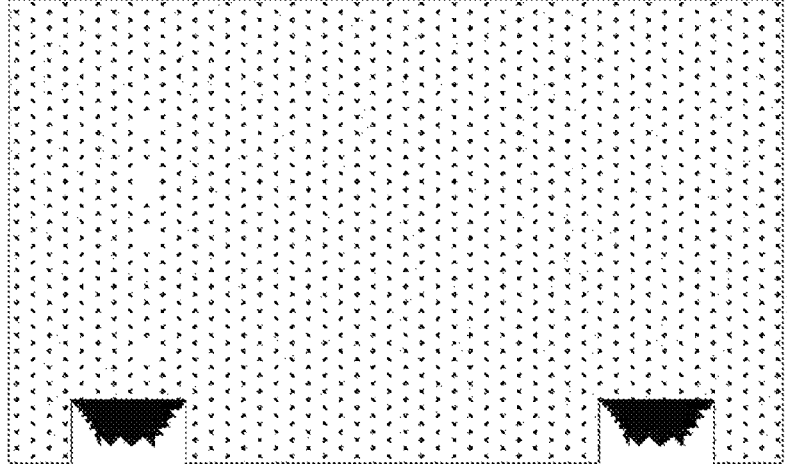
FIG. 24 illustrates a schematic view showing the structure of an eighth type of a flip LED chip in accordance with the embodiment A of the present disclosure.

Although in FIG. 21 to FIG. 23, only the friction coefficient of the bottom surface of the pad increases, in some other embodiments, in addition to increasing the friction coefficient of the bottom surface of the pad, the friction coefficient of the side surface of the pad increases. Alternatively, in some embodiments, both the friction coefficient of the bottom surface of the pad and the friction coefficient of the side surface of the pad can be increased at the same time. For example, in some embodiments, as shown in FIG. 24, the side surface of the pad may be of a zigzag shape, such as a triangular zigzag shape, a rectangular zigzag shape, or a combination shape of the triangular zigzag shape and the rectangular zigzag shape.

It is understood that, in this embodiment, one LED chip comprises two pads, and the configurations of the two pads may be not the same. For example, in some embodiments, the height of one of the pads is equal to the depth of the corresponding pad slot, and the height of the other pad is less than the depth of the corresponding pad slot. In some embodiments, the surface of one of the pads is rougher, and the surface of the other pad is smoother. In some embodiments, the surface of the pad is of a triangular zigzag shape, and the surface of the other pad is of a rectangular zigzag shape.

According to one or some embodiments of the present disclosure, the bottom portion of the chip body is provided with pad slots recessed upwardly for disposing the pads, and the height of the pad is less than or equal to the corresponding pas slot, so that a gap is between the side surface of the pad and the side wall of the pad slot. Therefore, the pads of the flip LED chip are received in the bottom portion of the chip body, rather than being protruding from the bottom portion of the chip body. Therefore, when the pad and the wiring board are soldered with each other by using the solder paste, the solder paste can penetrate the gap between the pad and the pad slot, so that the solder paste, the side surface of the pad, and the side wall of the pad slot can be bonded with each other. Therefore, the interaction force between the pad and the solder paste can be increased, thus increasing the reliability of the bonding between the pad and the wiring board.

Moreover, the friction coefficients of the bottom surface and the side surface of the pad of the flip LED chip may be configured to be a greater value. For example, the bottom surface of the pad or the bottom surface and the side surface of the pad are configured as zigzag-shaped. Therefore, in one aspect, the contact area between the pad and the solder paste can be increased, thereby increasing the friction force between the pad and the solder paste. Moreover, such configuration allows the surface of the pad and the solder paste to be firmly engaged with each other, thereby increasing the cut-off force between the pad and the solder paste. Therefore, the production yield of electronic products comprising the flip LED chips can be improved.

Figure 25:
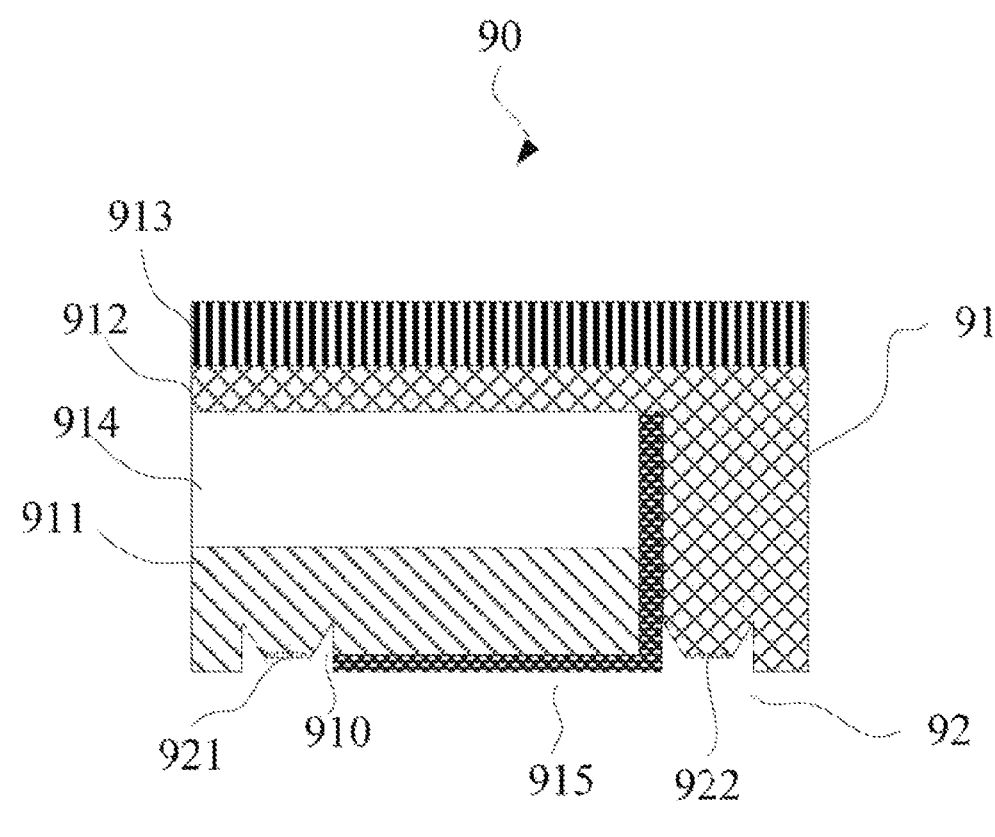
FIG. 25 illustrates a schematic view showing the structure of a flip LED chip in accordance with an embodiment B of the present disclosure.

Please refer to the flip LED chip 90 shown in FIG. 25. The flip LED chip 90 comprises a chip body 91 and pads 92. The pads 92 comprise an N electrode pad 921 and a P electrode pad 922. The N electrode pad 921 is integrally formed with the N-type current spreading layer 911 of the chip body 91, and the P electrode pad 922 is integrally formed with the P-type current spreading layer 912 of the chip body 91.

In addition to the N-type current spreading layer 911 and the P-type current spreading layer 912, the chip body 91 may further comprise a transparent protection layer 913, a light-emitting layer 914, and an isolation belt 915. The N-type current spreading layer 911, the light-emitting layer 914, and the P-type current spreading layer 912 are sequentially disposed below the transparent protection layer 913, from top to bottom. The transparent protection layer 913 is provided for protecting the N-type current spreading layer 911, the light-emitting layer 914, and the P-type current spreading layer 912. Therefore, it is understood that, in this embodiment, the transparent protection layer 913 has a greater hardness. In some embodiments, the transparent protection layer 913 may be a sapphire layer.

In this embodiment, an intersection between the N-type current spreading layer 911 and the P-type current spreading layer 912 forms a P-N junction. Likewise, the N electrode pad 921 and the P electrode pad 922 are isolated with each other through the isolation belt 915. As shown in FIG. 25, the N-type current spreading layer 911 and the P-type current spreading layer 912 are separated by the isolation belt 915, and the N electrode pad 921 and the P electrode pad 922 are also separated by the isolation belt 915. The isolation belt 915 shown in FIG. 25 is of an inversed L shape. Therefore, in this embodiment, the isolation belt 915 comprises a vertical portion and a horizontal portion. through the vertical portion of the isolation belt 915, the N-type current spreading layer 911 can be separated from the P-type current spreading layer 912, and the N electrode pad 921 can be separated from the P electrode pad 922. For ensuring the two pads from being conducted with each other during the soldering process, the horizontal portion of the isolation belt 915 is provided at the horizontal direction.

When the flip LED chip 90 is soldered on the wiring board and is applied with currents, the light-emitting layer 914 can emit light under the excitation of the N-type current spreading layer 911 and the P-type current spreading layer 912. The color of the light emitted by the light-emitting layer 914 is related to the material of the current spreading layer (that is, related to the material of the N electrode pad 921 and the P electrode pad 922). In this embodiment, both the materials of the N-type current spreading layer 911 and the P-type current spreading layer 912 are gallium nitride. Of course, in some embodiments, the N-type current spreading layer 911 and the P-type current spreading layer 912 may be made of, for example, gallium arsenide.

In this embodiment, corresponding pad slots 910 are disposed on the bottom of the chip body 91 to correspond to the N electrode pad 921 and the P electrode pad 922. The two pads 92 respectively correspond to the two pad slots 910. The pad slot 910 is recessed upwardly, and the pad 92 extends along a direction from the bottom of the pad slot 910 to the opening of the pad slot 210. However, in this embodiment, the depth of the pad slot 210 is slightly greater than the height of the pad 92. Therefore, the pad 92 does not extend above the opening of the pad slot 910. In some embodiments, the side wall of the pad slot 910 is vertically configured, a certain gap is between the pad 92 and the side wall of the pad slot 910, and the gap gradually increases from the bottom of the pad slot 910 to the opening of the pad slot 910. In other words, in these embodiments, the cross-sectional area of the pad 92 gradually decreases from the bottom of the pad slot 910 to the opening of the pad slot 910.

In this embodiment, the pad 92 is engaged in the pad slot 910. Therefore, upon soldering the flip LED chip 90, the melted solder paste penetrates the gap between the pad 92 and the pad slot 910 easily to contact the side surface of the pad 92. Therefore, the contact area between the pad 92 and the solder paste is increased, thereby increasing the cut-off force between the pad 92 and the solder paste.

In order to further increase the reliability of the soldering of the flip LED chip 90, in this embodiment, the friction coefficient of the surface of the pad 92 is configured to be a greater value. For example, in FIG. 25, both the side surface and the bottom surface of the pad 92 are wavy shaped. Therefore, through configuring the bottom surface and the side surface of the pad 92 from smooth to wavy, the contact area between the pad 92 of the flip LED chip and the solder paste can be increased, thereby increasing the pushing force of the flip LED chip and ensuring the product quality and reliability.

Figure 26:
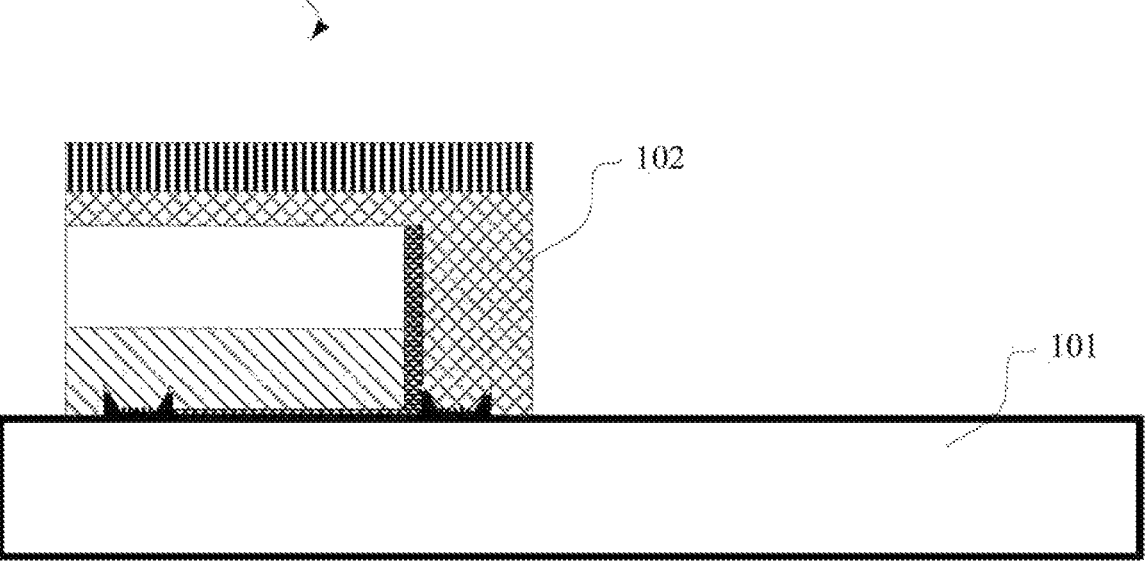
FIG. 26 illustrates a schematic view showing the structure of a wiring board in accordance with an embodiment C of the present disclosure.

In this embodiment, a wiring board is provided. Please refer to FIG. 26. The wiring board 100 comprises a substrate 101 and at least one flip LED chip 102. The structure of the flip LED chip 102 can be referred to aforementioned embodiments and is not iterated here. A circuitry is in the substrate 101, and a surface of the substrate 101 comprises a chip configuration region. The flip LED chip 102 may be soldered in the chip configuration region through the solder paste, so that the flip LED chip 102 is electrically connected to the circuitry in the substrate 101.

Upon soldering the flip LED chip 102 to the chip configuration region, the melted solder paste is not only bonded to the bottom surface of the pad of the flip LED chip 102, but also penetrate the gap between the pad and the side wall of the pad slot, so that the solder paste is bonded to the side surface of the pad. Therefore, the contact area between the solder paste and the pad of the flip LED chip 102 can be increased by a certain extent, thereby increasing the bonding between the solder paste and the pad.

Moreover, in some embodiments, at least one of the bottom surface and the side surface of the pad of the flip LED chip 102 is rougher and of a wavy shape and/or a zigzag shape. Hence, not only the contact area between the pad and the solder paste can be increased so that the friction force between the pad and the solder paste can be increased as well, but also the surface of the pad and the solder paste can be engaged with each other, thereby improving the cut-off force between the pad and the solder paste.

[The Pad]

Figure 27:
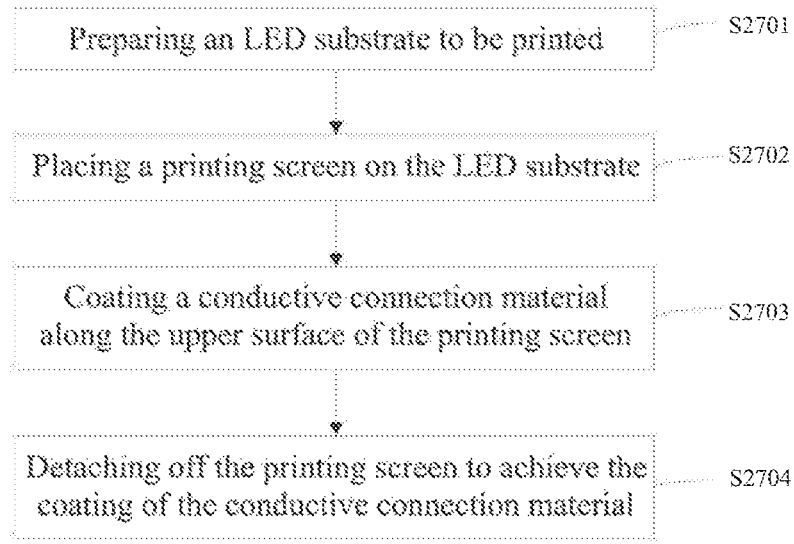
FIG. 27 illustrates a flowchart of a method for configuring an LED pad in accordance with an embodiment of the present disclosure.

In order to increase the reliability of the flip LED chip module, an embodiment of the present disclosure also provides a method for configuring an LED pad to correspond to the pad slot of the flip LED chip. Please refer to the embodiment shown in FIG. 27, the method comprises:

Step S2701: preparing an LED substrate to be printed;

Step S2702: placing a printing screen on the LED substrate, wherein the printing screen is a plate of a block shape, and the plate has a plurality of through holes defined through an upper surface of the plate and a lower surface of the plate, and a hole diameter of each of the through holes gradually increases along a direction from the upper surface of the plate to the lower surface of the plate; a position of the through hole corresponds to a position of the LED pad of the LED substrate;

Step S2703: coating a conductive connection material along the upper surface of the printing screen, wherein the conductive connection material is poured into the through holes to cover the corresponding LED pads;

Step S2704: detaching off the printing screen to achieve the coating of the conductive connection material.

In the mini LED, several small-sized LEDs are arranged as an array. Because the size of the LED is small, during the printing process, the pad of the LED substrate is also small and the number of the pad is larger. As a result, the LEDs are not coated with the conductive connection material in a one-by-one manner, which has a very low efficiency. Accordingly, the screen printing technique is applied for coating the conductive connection material on the LEDs.

That is, in this embodiment, during the printing procedure, the printing screen is placed on the LED substrate, and the through holes of the printing screen faces the pads. Then, the printing screen is coated with the conductive connection material, and the conductive connection material flows through the through hole and thus on the pad. After these steps, the coating of the conductive connection material is achieved.

During the printing process, the demolding of the conductive connection material is important. In this embodiment, as shown in FIG. 28 to FIG. 31, the printing screen adopted in the LED pad configuration method is a plate 281 of a block shape, and the plate 281 has a plurality of through holes 282 defined through an upper surface of the plate 281 and a lower surface of the plate 281, and a hole diameter of each of the through holes 282 gradually increases along a direction from the upper surface of the plate 281 to the lower surface of the plate 281. For the printing screen, the upper surface of the plate 281 corresponds to the portion where the glue or the solder paste is poured into, and the lower surface of the plate 281 corresponds to the portion where the glue or the solder paste is ejected out. As compared with the upper surface of the plate 281, the lower surface of the plate 281 is nearer to the substrate. The through holes 282 on the plate 281 are provided as pouring holes for the conductive connection material, and the size of the through hole 282 may be determined according to the pad region of the substrate. In this embodiment, the feature of the through hole 282 is that the hole diameter of the through hole gradually increases along the direction from the upper surface of the plate 281 to the lower surface of the plate 281. Therefore, under such configuration, the outline size of the pouring hole at the upper surface of the plate 281 may be slightly less than the adhering or soldering spot on the substrate, and the outline size of the pouring hole at the lower surface of the plate 281 may be equal to or slightly greater than the adhering or soldering spot.

For the small-size through hole 282, the conductive connection material is prone to be attached on the hole wall or the lower surface of the through hole 282. Therefore, in this embodiment, the through hole 282 is configured to have a narrower top and a wider bottom. Therefore, the difference of the sizes of the through hole 282 at the top and the bottom increases objectively. Therefore, the conductive connection material tends to move toward the lower surface, thus increasing the demolding performance of the conductive connection material.

In this embodiment, the flip LED chip may be, but not limited to, a chip in which the bottom portion of the chip body is provided with pads. The bottom portion of the chip body is provided with two pad slots recessed upwardly. The N electrode pad of the chip is disposed on a bottom of one of the two pad slots, the P electrode pad of the chip is disposed on a bottom of the other of the two pad slots, and a gap is between a side surface of each of the pads and a side wall of a corresponding pad slot of the two pad slots. Therefore, upon soldering the flip LED chip on the wiring board, the melted solder paste can penetrate the gap and bond to the side surface of the pad. Therefore, the bonding between the solder paste and the pad can be achieved more sufficiently, thereby improving the reliability of soldering the flip LED chip with the wiring board.

In this embodiment, the conductive connection material may comprise one selected from the group consisting of solder paste and silver glue. In the case that the conductive connection material comprises the solder paste, the composition of the solder paste comprise gallium. The mini/micro LEDs belong to products with massive chip transfer and integration. The production time of the min/micro LEDs is long, and surface the solder paste is demanded not to become fogged or gray/black under a long-time operation. When the solder paste contains gallium, the production time of the pad can be extended to 24 hours.

In some embodiments, in the case that the conductive connection material comprises the silver glue, the composition of the silver glue comprises a mixture of silver powders and glue, and the silver powders comprise silver particles and silver bulks. The silver bulks are plate shaped and has a greater mobility. Because the contact between the silver bulks are in a surface-contact or a line-contact manner, the contact area between the silver bulks is greater than the contact area between the silver particles (which is in a point-contact manner). Therefore, the silver bulk has a lower resistance and a better electrical conductivity. During the process of forming column structures with the silver bulks and the silver particles through high-temperature sintering, the silver particles are filled into the gaps between the silver bulks, so that the column structures can be formed, thereby not only increasing the bonding ability but also the electrical conductivity of the conductive connection material.

Specifically, according to some embodiments, in the composition of the silver glue, the size of the silver particles is in a range between 10 μm and 15 μm, the size of the silver bulks is in a range between 15 μm and 20 μm, and the ratio between the silver particles and silver bulks is 1:1. For achieve a better effect, the size tolerance of the silver particles and the silver bulks is within 1 μm.

In some embodiments, the outline of the through hole 282 may be rectangular, circular, or elliptical, and the shapes of the through holes 282 of the same printing screen are the same. The outline of the through hole 282 is a regular shape. The outline of the through hole 282 usually depends on the printing requirements. For example, the outline of the through hole 282 may be determined according to the shape of the LED chip, the shape of the adhering or soldering spots, or the like. In general, the shape of the through hole 282 is a regular shape, and the regular shape may be, but not limited to, a triangle, a parallelogram, a pentagon, a circle, a ellipse, or the like.

In some embodiments, the hole wall of the through hole 282 may be curved or inclined. Because the through hole 282 has a narrower top and a wider bottom, the connection between the top and the bottom may be an inclined surface or a curved surface. In the case that the outline of the through hole 282 is a curved shape, such as a circle or an ellipse, the hole wall of the through hole 282 is curved; while in the case that the outline of the through hole 282 is a polygon, such as a rectangle or a square, the hole wall of the through hole 282 may be inclined or curved.

Specifically, in some embodiments, in the case that the outline of the through hole 282 is circular or elliptical, the hole wall of the through hole 282 is curved; while in the case that the outline of the through hole 282 is rectangular or squared, the hole wall of the through hole 282 is formed by four inclined surface or four curved surfaces. The combination of the hole walls is achieved by arranging the hole walls of the through hole along four sides of the rectangle or the square to form an inversely-arranged tunnel structure.

In some embodiments, the inclination of the hole wall of the through hole 282 is proportional to the thickness of the plate 281. A main function of the printing screen is to print and to demold the paste. The thicker the plate 281 is, the harder the demolding is. Therefore, a greater inclination of the through hole 282 is provided to enhance the demolding performance. In this embodiment, the inclination indicates that the inclination of the hole wall of the through hole 282 with respect to the normal direction of the printing screen.

In some embodiments, the angle between the hole wall of the through hole 282 and the lower surface of the plate 281 is in a range between 10 degrees and 85 degrees. The smaller the angle between the hole wall of the through hole 282 and the lower surface of the plate 281 is, the larger the inclination of the hole wall of the through hole 282, and the better the demolding performance is.

In some embodiments, in the case that the through hole 282 is rectangular, an edge portion or a corner portion of the through hole 282 on a lower surface of the plate 281 is provided with a chamfer structure 283 or a notch. Please refer to FIG. 31, the chamfer structure 283 or the notch allows a better demolding performance.

In some embodiments, after the step of detaching off the printing screen to achieve the coating of the conductive connection material, the method further comprises:

Placing the LED chips on the corresponding pad regions to achieve the electrical connection.

Figure 28:
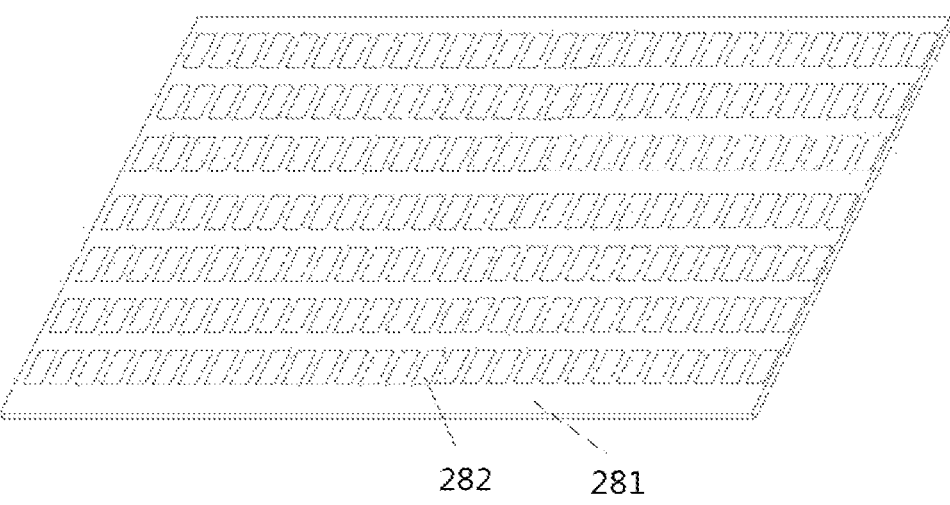
FIG. 28 illustrates a schematic view showing the structure of a printing screen in accordance with an embodiment of the present disclosure.
Figure 29:
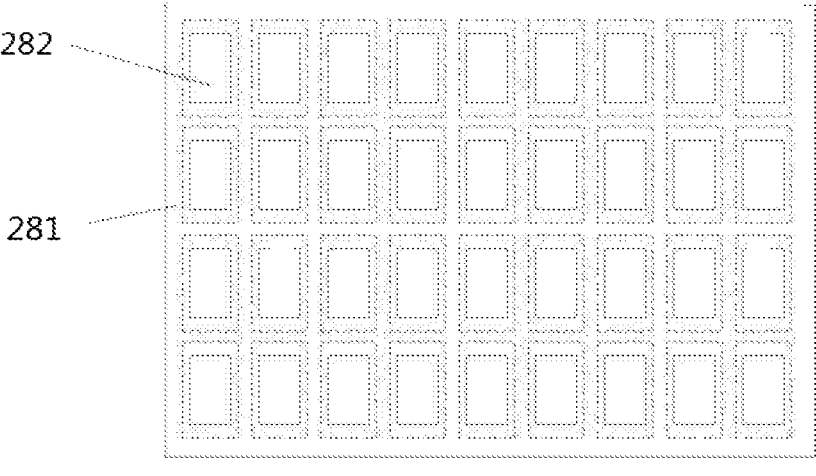
FIG. 29 illustrates a partial top view of a printing screen in accordance with an embodiment of the present disclosure.
Figure 30:
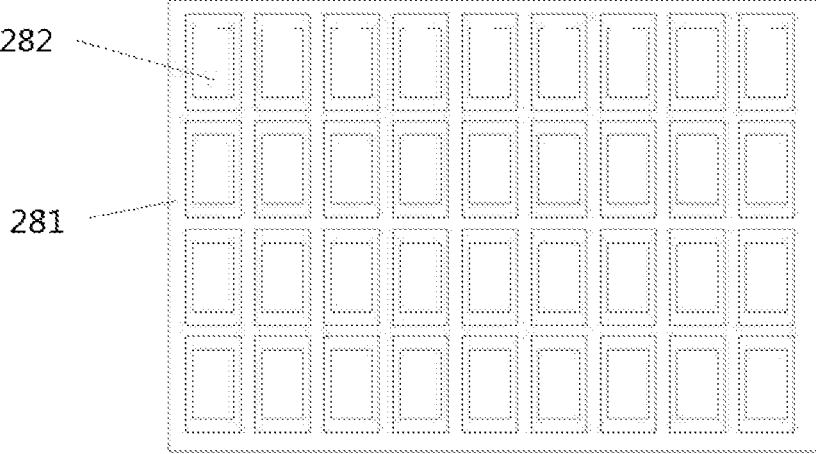
FIG. 30 illustrates a partial bottom view of a printing screen in accordance with an embodiment of the present disclosure.
Figure 31:
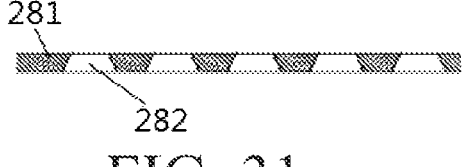
FIG. 31 illustrates a schematic cross-sectional view of a printing screen with through holes in accordance with an embodiment of the present disclosure.
Figure 32:
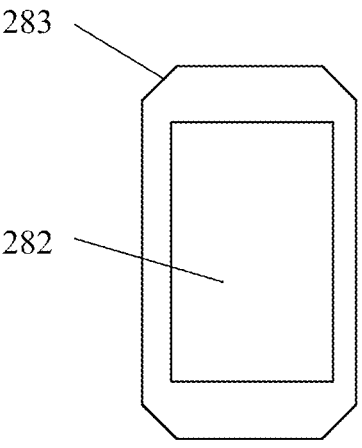
FIG. 32 illustrates a schematic view of the chamfer structures of the bottom surface of a through hole of a printing screen in accordance with an embodiment of the present disclosure.

Please refer to the embodiments shown in FIG. 28 to FIG. 30. In this embodiment, another printing screen is provided. The printing screen is a plate 281 of a block shape, and the plate 281 has a plurality of through holes 282 defined through an upper surface of the plate 281 and a lower surface of the plate 281, and a hole diameter of each of the through holes 282 gradually increases along a direction from the upper surface of the plate 281 to the lower surface of the plate 281. For the printing screen, the upper surface of the plate 281 corresponds to the portion where the glue or the solder paste is poured into, and the lower surface of the plate 281 corresponds to the portion where the glue or the solder paste is ejected out. As compared with the upper surface of the plate 281, the lower surface of the plate 281 is nearer to the substrate. The through holes 282 on the plate 281 are provided as glue-pouring holes or paste-applying holes, and the size of the through hole 282 may be determined according to the adhering or soldering spots on the substrate, that is, according to the pad. In this embodiment, the feature of the through hole 282 is that the hole diameter of the through hole gradually increases along the direction from the upper surface of the plate 281 to the lower surface of the plate 281. Therefore, under such configuration, the outline size of the glue-pouring hole at the upper surface of the plate 281 may be slightly less than the adhering or soldering spot on the substrate, and the outline size of the glue-pouring hole at the lower surface of the plate 281 may be equal to or slightly greater than the adhering or soldering spot.

For the small-size through hole 282, the solder paste and the glue are prone to be attached on the hole wall or the lower surface of the through hole 282. Therefore, in this embodiment, the through hole 282 is configured to have a narrower top and a wider bottom. Therefore, the difference of the sizes of the through hole 282 at the top and the bottom increases objectively. Therefore, the solder paste and the glue tend to move toward the lower surface, thus increasing the demolding performance of the solder paste and the glue.

In some embodiments, the printing screen is made of steel or nickel. Depending on the difference of the material, the printing screens can be classified as steel screens and nickel screens. The steel screen is made of stainless steel, while the nickel screen is made of nickel. The major difference between the steel screen and the nickel screen is the cost and the manufacture as well as the demolding performance. In general, the cost of the steel screen is lower than the cost of the nickel screen. In the manufacture of the steel screen, the mesh structure is formed by a punching process, and such process causes barbs on the inner wall of the through hole to affect the demolding performance. The cost of the nickel screen is higher; however, the nickel screen has a smoother wall surface and thus a better demolding performance.

In some embodiments, in the case that the printing screen is nickel, the printing screen is manufactured by using evaporation to growth nickel. The manufacture of the nickel screen involves photolithography, metal thin-film deposition, electro-casting, corrosion, or the like. The metal thin-film deposition, that is, vapor deposition is substantially considered the same as the evaporation for nickel growth. For different conductive connection materials, different printing screens can be chosen correspondingly. For example, for nano-scale silver glue, the amount of nonmetal ingredients is low, and the tension between the particles are small, thus having a higher mobility (easy to be dispersed), so that the silver glue requests a higher degree of the smoothness of the hole wall during the printing process. Hence, when the silver glue is used as the conductive connection material, adopting the nickel screen is proper. On the other hand, for the solder paste, the amount of nonmetal ingredients is high, and the tension between the particles are large, thus having a lower mobility (hard to be dispersed). Hence, when the solder paste is used as the conductive connection material, adopting the steel screen which has a lower cost is enough to meet the product requirements.

In some embodiments, a smooth covering layer is provided on the hole wall of the through hole 282. In one embodiment, the object of the smooth covering layer is to further increase the demolding performance. In this embodiment, the term "smooth" indicates that, after the smooth covering layer is covered on the hole wall of the through hole 282, the kinetic friction coefficient $\mu$ between the hole wall of the through hole 282 and the solder paste or the glue is smaller than that between the uncovered hole wall of the through hole 282 and the solder paste or the glue. In general, the less the kinetic friction coefficient $\mu$ is, the better the demolding performance is.

In some embodiments, the smooth covering layer is a nickel-coating layer. Coating nickel may be implemented by using electrocoating. For the steel screen, in general, the smoothness of the through hole 282 is increased by coating nickel on the hole wall. On the other hand, because the nickel screen is made of nickel, no nickel coating procedure has to be applied to the nickel screen.

In some embodiments, the lower surface of the plate is coated with a nanoparticle-coating layer. The function of the nanoparticle-coating layer is also for facilitating the demolding process. During applying the glue or the solder paste, the glue and the solder paste may be attached on the lower surface of the steel plate, and the nanoparticle-coating layer can prevent the attaching of the glue or paste as much as possible.

The glue or the solder paste mentioned in the embodiments belong to different technical fields of the LED pad. The glue is a conductive glue and achieve the connection by attaching. Optionally, the glue is a nanoparticle silver glue. For the solder paste, other metals (such as gallium) with a certain ratio may be added into a commercial solder paste for longer operation time.

The invention has been described above in terms of the embodiments, and it should be understood by those skilled in the art that the present invention is not intended to limit the scope of the invention. It should be noted that variations and permutations equivalent to those of the embodiments are intended to be within the scope of the present invention. Therefore, the scope of the invention is defined by the scope of the appended claims.

What is claimed is:

1. A flip LED chip module, comprising:
a chip body; and
pads on a bottom portion of the chip body, wherein the pads comprise an N electrode pad and a P electrode pad;
wherein the bottom portion of the chip body is provided with two pad slots recessed upwardly, the N electrode pad is disposed on a bottom of one of the two pad slots, the P electrode pad is disposed on a bottom of the other of the two pad slots, and a gap is between a side surface of each of the pads and a side wall of a corresponding pad slot of the two pad slots;
wherein the gap between the side surface of each of the pads and the side wall of the corresponding pad slot gradually increases from the bottom of the corresponding pad slot to the opening of the corresponding pad slot distant from the bottom of the corresponding pad slot.

2. The flip LED chip module according to claim 1, wherein, an absolute value of a difference between a height of each of the pads and a depth of the corresponding pad slot is less than or equal to 20 $\mu m$.

3. The flip LED chip module according to claim 1, wherein a cross-sectional area of each of the pads gradually decreases from the bottom of the corresponding pad slot to an opening of the corresponding pad slot distant from the bottom of the corresponding pad slot.

4. The flip LED chip module according to claim 1, wherein the chip body is a micro LED chip or a mini LED chip.

5. The flip LED chip module according to claim 1, wherein the bottom surface and/or the side surface of each of the pads is zigzag-shaped or wavy-shaped.

6. A flip LED chip module, comprising:
a substrate; and
a flip LED chip, wherein a conductive connection material is provided on portions of an upper surface of the substrate corresponding to pads of the flip LED chip;
wherein a positive electrode and a negative electrode of the flip LED chip are disposed on the portions of the substrate covered by the conductive connection material and are electrically connected to the pads of flip LED chip;
wherein a bottom portion of a chip body of the flip LED chip is provided with two pad slots recessed upwardly, the pad corresponding to the positive electrode is disposed on a bottom of one of the two pad slots, and the pad corresponding to the negative electrode is disposed on a bottom of the other one of the two pad slots; a gap is between a side surface of each of the pads and a side wall of a corresponding pad slot of the two pad slots;
wherein the gap between the side surface of each of the pads and the side wall of the corresponding pad slot gradually increases from the bottom of the corresponding pad slot to the opening of the corresponding pad slot distant from the bottom of the corresponding pad slot.

7. The flip LED chip module according to claim 6, wherein the conductive connection material is coated and formed on the pads by using a printing screen; the printing screen is a plate of block shaped, the plate has a plurality of through holes defined through an upper surface and a lower surface of the plate, and a hole diameter of each of the through holes gradually increases along a direction from the upper surface of the plate to the lower surface of the plate.

8. The flip LED chip module according to claim 6, wherein the conductive connection material comprises one selected from the group consisting of solder paste and silver glue.

9. The flip LED chip module according to claim 8, wherein in the case that the conductive connection material comprises solder paste, a composition of the solder paste comprises germanium; in the case that the conductive connection material comprises silver glue, a composition of the sliver paste comprises a mixture of sliver powders and glue, and the sliver powders comprise silver particles and silver bulks.

10. The flip LED chip module according to claim 6, wherein a cross-sectional area of each of the pads gradually decreases from the bottom of the corresponding pad slot to an opening of the corresponding pad slot distant from the bottom of the corresponding pad slot.

\* \* \* \* \*